(12) United States Patent
Lee et al.

(10) Patent No.: US 11,008,513 B2
(45) Date of Patent: *May 18, 2021

(54) COMPOSITION FOR ETCHING

(71) Applicant: SOULBRAIN CO., LTD., Gyeonggi-do (KR)

(72) Inventors: Jin Uk Lee, Daejeon (KR); Jae Wan Park, Daegu (KR); Jung Hun Lim, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/579,866

(22) Filed: Sep. 24, 2019

(65) Prior Publication Data
US 2020/0024517 A1 Jan. 23, 2020

Related U.S. Application Data

(63) Continuation of application No. 15/844,712, filed on Dec. 18, 2017, now Pat. No. 10,465,112, which is a continuation of application No. 14/797,050, filed on Jul. 10, 2015, now Pat. No. 9,868,902.

(30) Foreign Application Priority Data

Jul. 17, 2014 (KR) .................. 10-2014-0090660
Jul. 17, 2014 (KR) .................. 10-2014-0090661
Jul. 17, 2014 (KR) .................. 10-2014-0090662
Jul. 17, 2014 (KR) .................. 10-2014-0090663
Jun. 3, 2015 (KR) .................. 10-2015-0078400

(51) Int. Cl.
*C09K 13/06* (2006.01)
*H01L 21/02* (2006.01)
*H01L 29/66* (2006.01)
*H01L 27/11556* (2017.01)
*H01L 21/311* (2006.01)

(52) U.S. Cl.
CPC .......... *C09K 13/06* (2013.01); *H01L 21/0214* (2013.01); *H01L 21/02458* (2013.01); *H01L 21/31111* (2013.01); *H01L 27/11556* (2013.01); *H01L 29/66825* (2013.01)

(58) Field of Classification Search
CPC ........................... C09K 13/06; H01L 21/31111
USPC ................ 438/745, 753–757; 252/79.1–79.2
See application file for complete search history.

(56) References Cited

U.S. PATENT DOCUMENTS

| | | | | |
|---|---|---|---|---|
| 6,646,348 B1 * | 11/2003 | Grumbine | ................ | C09G 1/02 |
| | | | | 257/752 |
| 9,868,902 B2 * | 1/2018 | Lee | ...................... | H01L 21/0214 |
| 2007/0128454 A1 * | 6/2007 | Im | ............................ | G02B 1/14 |
| | | | | 428/447 |

FOREIGN PATENT DOCUMENTS

| | | |
|---|---|---|
| CN | 103160282 A | 6/2013 |
| JP | 2009021538 A | 1/2009 |
| JP | 2013128109 A | 6/2013 |
| KR | 1020130076918 A | 7/2013 |

(Continued)

*Primary Examiner* — Duy Vu N Deo
(74) *Attorney, Agent, or Firm* — Jongkook Park

(57) ABSTRACT

The disclosure is related to a composition for etching, a method for manufacturing the composition, and a method for fabricating a semiconductor using the same. The composition may include a first inorganic acid, at least one of silane inorganic acid salts produced by reaction between a second inorganic acid and a silane compound, and a solvent. The second inorganic acid may be at least one selected from the group consisting of a sulfuric acid, a fuming sulfuric acid, a nitric acid, a phosphoric acid, and a combination thereof.

2 Claims, 7 Drawing Sheets

(56) References Cited

FOREIGN PATENT DOCUMENTS

| | | |
|---|---|---|
| KR | 1020130125561 A | 11/2013 |
| TW | 201331343 A | 8/2013 |

* cited by examiner

COMPOSITION FOR ETCHING

CROSS REFERENCE TO PRIOR APPLICATIONS

The present is continuation application of U.S. patent application Ser. No. 15/844,712, entitled "Composition for Etching", filed on Dec. 18, 2017, which is a continuation application of U.S. patent application Ser. No. 14/797,050, entitled "Composition of Etching", filed on Jul. 10, 2015, now U.S. Pat. No. 9,868,902, which claims priority under 35 U.S.C. 119 to Korean Patent Application Nos. 10-2014-0090660, filed on Jul. 17, 2014, 10-2014-0090661, filed on Jul. 17, 2014, 10-2014-0090662, filed on Jul. 17, 2014, 10-2014-0090663, filed on Jul. 17, 2014, and 10-2015-0078400, filed on Jun. 3, 2015, in the Korean Intellectual Property Office, the entirety of all seven of which are expressly incorporated herein by reference.

BACKGROUND

The present disclosure relates to a composition for an etching process, and more particularly, to a high-selectivity etching composition capable of selectively removing a nitride layer while minimizing an etch rate of an oxide layer and to a method for fabricating a semiconductor using the etching composition.

In manufacturing semiconductors, an oxide layer and a nitride layer have been used as an insulating layer. The oxide layer may include a silicon oxide ($SiO_2$) layer, and the nitride layer may include a silicon nitride ($SiN_2$) layer. The silicon oxide layer and the silicon nitride ($SiN_2$) layer are used independently or alternatively stacked with each other as the insulating layer. Furthermore, the oxide layer and the nitride layer may be used as a hard mask for forming a conductive pattern for metal interconnections.

A wet etching process may be carried out for removing such a nitride layer. Typically, as an etching composition, a mixture of a phosphoric acid and deionized water is used for removing the nitride layer. The deionized water may be added to prevent deterioration of an etching rate and variation of etching selectivity. However, even small variation in a supplied amount of the deionized water might cause defects in the etching process for removing the nitride layer. Furthermore, it is very difficult to handle the phosphoric acid because the phosphoric acid has strong acid property and has corrosiveness or causticity.

In order to overcome such defect of the typical etching composition, etching composition including phosphoric acid ($H_3PO_4$) mixed with one of hydrofluoric acid (HF) and nitric acid ($HNO_3$) was introduced. However, such etching composition deteriorates the etching selectivity of a nitride layer and an oxide layer. Another etching composition including a phosphoric acid and one of a silicate and a silicic acid was introduced. However, the silicate and the silicic acid cause generating particles that badly influence a substrate.

SUMMARY

This summary is provided to introduce a selection of concepts in a simplified form that is further described below in the Detailed Description. This summary is not intended to identify key features or essential features of the claimed subject matter, nor is it intended to be used to limit the scope of the claimed subject matter.

Embodiments of the present invention overcome the above disadvantages and other disadvantages not described above. Also, embodiments of the present invention are not required to overcome the disadvantages described above, and embodiments of the present invention may not overcome any of the problems described above.

In accordance with an aspect of the present embodiment, an etching composition may be provided for selectively removing a nitride layer with minimizing an etching rate of an oxide layer.

In accordance with another aspect of the present embodiment, an etching composition having high selectivity may be provided for preventing generation of particles during an etching process.

In accordance with still another aspect of the present embodiment, a method may be provided for manufacturing a semiconductor using an etching composition having high selectivity for selectively removing a nitride layer while minimizing an etching rate of an oxide layer.

In accordance with at least one embodiment, a composition may include a first inorganic acid, at least one of silane inorganic acid salts produced by reaction between a second inorganic acid and a silane compound, and a solvent. The second inorganic acid may be at least one selected from the group consisting of a sulfuric acid, a fuming sulfuric acid, a nitric acid, a phosphoric acid, an anhydrous phosphoric acid, and a combination thereof. The silane compound may be a compound represented by a first formula:

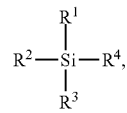

where each one of R1 to R4 is selected from the group consisting of hydrogen, halogen, (C1-C10) alkyl, (C1-C10) alkoxy, and (C6-C30) aryl, and at least one of R1 to R4 is one of halogen and (C1-C10) alkyl.

In accordance with another embodiment, a composition may include a first inorganic acid, at least one of silane inorganic acid salts produced by reaction between a polyphosphoric acid and a silane compound, and a solvent.

In accordance with another embodiment, a composition may include a first inorganic acid, at least one of siloxane inorganic acid salts generated through reaction between a second inorganic acid and a siloxane compound, and a solvent. The second inorganic acid may be one selected from the group consisting of a phosphoric acid, an anhydrous phosphoric acid, a pyrophosphoric acid, a polyphosphoric acid, and a combination thereof.

In accordance with another embodiment, a composition may include a first inorganic acid, at least one of siloxane inorganic acid salts generated through reaction between a second inorganic acid and a siloxane compound, and a solvent. The second inorganic acid may be one selected from the group consisting of a sulfuric acid, a fuming sulfuric acid, and a combination thereof.

In accordance with another embodiment, a composition may include a first inorganic acid, at least one of siloxane inorganic acid salts produced through reaction induced between a second inorganic acid including a nitric acid and a siloxane compound, and a solvent.

In accordance with another embodiment, a composition may include a first inorganic acid, at least one of silane inorganic acid salts generated by reaction induced between a second inorganic acid and a first silane compound, a second silane compound, and a solvent. The second inorganic acid may be one selected from the group consisting of a sulfuric acid, a fuming sulfuric acid, a nitric acid, a phosphoric acid, an anhydrous phosphoric acid, a pyrophosphoric acid, a polyphosphoric acid, and a combination thereof. The first silane compound and the second silane compound may be one selected from the group consisting of compounds represented by a tenth formula, compounds represented by an eleventh formula, and a combination thereof. The tenth formula is:

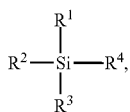

and
wherein the eleventh formula is:

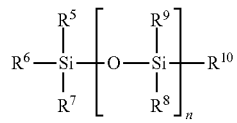

where i) each one of $R^1$ to $R^{10}$ is selected from the group consisting of hydrogen, halogen, (C1-C10) alkyl, (C1-C10) alkoxy, and (C6-C30) aryl, ii) at least one of R1 to R4 is one of halogen and (C1-C10) alkoxy, iii) at least one of R5 to R10 is one of halogen and (C1-C10) alkoxy, and iv) n is one of integer numbers from 1 to 10.

In accordance with another embodiment, a method may be provided for fabricating a semiconductor device. The method may include an etching process carried out using the etching composition.

BRIEF DESCRIPTION OF THE DRAWINGS

The above and/or other aspects of the present invention will become apparent and more readily appreciated from the following description of embodiments, taken in conjunction with the accompanying drawings, of which.

DESCRIPTION OF EMBODIMENTS

Figure 1A:
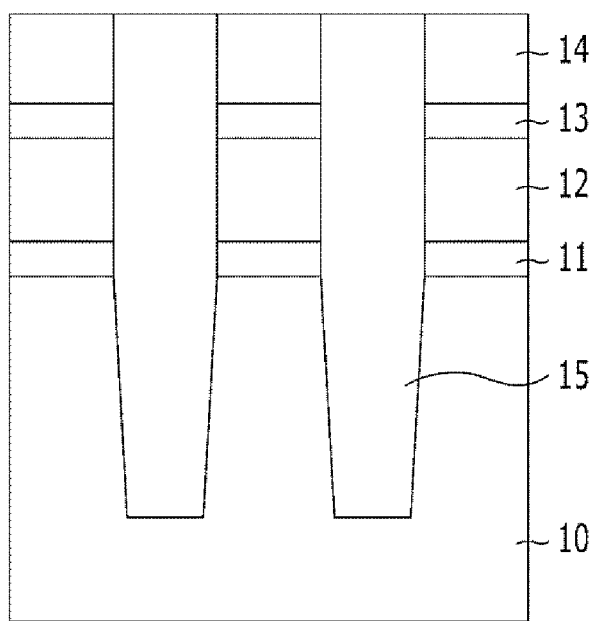
FIG. 1A and FIG. 1B illustrate a device isolation process for a flash memory device.

Reference will now be made in detail to embodiments of the present invention, examples of which are illustrated in the accompanying drawings, wherein like reference numerals refer to like elements throughout. The embodiments are described below, in order to explain the present invention by referring to the figures.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also refers to a case where a third layer exists to between the first layer and the second layer or the substrate.

Throughout the specification, a term "$(C_1-C_{10})$ alkyl" denotes a straight-chain or branched non-cyclic saturated hydrocarbon having 1 to 10 carbon atoms, and a term "$(C_1-C_{10})$ alkoxy" means a straight-chain or branched non-cyclic hydrocarbon having one or more ether groups and 1 to 10 carbon atoms.

In accordance with at least one embodiment, an etching composition may include a first inorganic acid, at least one of silane inorganic acid salts, and a solvent. The at least one of silane inorganic acid salts may be generated by reaction between a second inorganic acid and a silane compound.

The at least one of silane inorganic acid salts contained in the etching composition may enable easy and effective control of an etch rate of an oxide layer and also enable easy control of an effective field oxide height (EFH) in manufacturing a semiconductor device in accordance with at least one embodiment.

Hereinafter, such an etching composition in accordance with at least one embodiment will be described with reference to the accompanying drawings. Prior to describing the etching composition in accordance with at least one embodiment, typical use of an etching composition in manufacturing a semiconductor device will be described with reference to FIG. 1A to FIG. 1B.

Figure 1B:
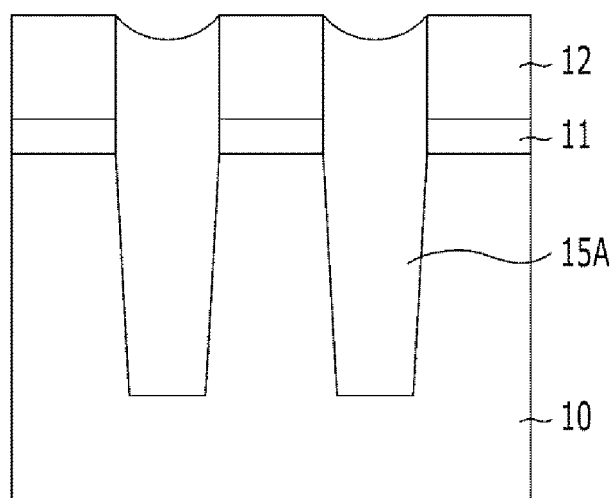

FIG. 1A and FIG. 1B illustrate a device isolation process for a flash memory device. Referring to FIG. 1A, tunnel oxide file 11, polysilicon layer 12, buffer oxide layer 13, and pad nitride layer 14 are sequentially formed on substrate 10. At least one trench is formed by selectively etching polysilicon layer 12, buffer oxide layer 13, and pad nitride layer 14. A gap filling process is carried out for filling the at least one trench by forming SOD oxide layer 15. Then, a chemical mechanical polishing (CMP) process may be carried out using pad nitride layer 14 as a polishing stopper layer.

Referring to FIG. 1B, pad nitride layer 14 is removed by performing a wet etching process using a phosphoric acid solution. Buffer oxide layer 13 is removed through a cleaning process. As a result, element isolation layer 15A is formed. However, when the phosphoric acid solution is used in the wet etching process, the etching selectivity of the nitride layer and the oxide layer is degraded. Due to such degradation, SOD oxide layer 15 may be removed as well as pad nitride layer 14, and it is difficult to control an effective field oxide height (EFH). Accordingly, due to the phosphoric acid solution, it is difficult i) to secure a sufficient time for wet etching to remove pad nitride layer 14, ii) an additional process may be required, and iii) the phosphoric acid solution causes variation that badly influences device properties.

Therefore, there is a demand for a high selectivity etching composition having high in order to selectively etch a nitride layer in respect to an oxide layer without generating particle.

In order to overcome defects of a typical etching composition and satisfy the demand, a high selectivity etching composition for selectively removing a nitride layer while minimizing an etch rate of an oxide layer is provided in accordance with at least one embodiment. Such an etching composition may include a first inorganic acid, at least one of silane inorganic acid salts, and a solvent. The at least one of silane inorganic acid salts may be produced by reaction between a second inorganic acid and a silane compound in accordance with at least one embodiment.

Due to the at least one of silane inorganic acid salts contained in the etching composition, easy and effective control of an etch rate of an oxide layer may be enabled. Accordingly, an effective field oxide height (EFH) may be easily and effectively controlled in manufacturing a semiconductor device in accordance with at least one embodiment.

As described, the at least one of silane inorganic acid salts may be produced as a result of repeated and continuous reaction between the second inorganic acid and the silane compound. Accordingly, the at least one of silane inorganic acid salts may include various chemical formulas instead of having single chemical formula.

The second inorganic acid may be one selected from the group consisting of a sulfuric acid, a fuming sulfuric acid, a nitric acid, a phosphoric acid, an anhydrous phosphoric acid, a pyrophosphoric acid, a polyphosphoric acid, and a combination thereof. Preferably, the second inorganic acid may be one of a sulfuric acid, a nitric acid, and a phosphoric acid.

The silane compound may be one selected from the group consisting of compounds represented by Formulas A1 to A2 below and a combination thereof.

[Formula A1]

In the Formula A1, each one of $R^1$ to $R^4$ may be selected from the group consisting of hydrogen, halogen, ($C_1$-$C_{10}$) alkyl, ($C_1$-$C_{10}$) alkoxy, and ($C_6$-$C_{30}$) aryl. Furthermore, at least one of $R^1$ to $R^4$ may be one of halogen and ($C_1$-$C_{10}$) alkyl.

The halogen may include fluoro, chloro, bromo, and iodo. Preferably, the halogen may be one of fluoro and chloro.

In particular, the silane compound represented by the Formula A1 may include a halo silane compound and an alkoxy silane compound.

The halo silane compound may be selected from the group consisting of trimethylchlorosilane, triethylchlorosilane, tripropylchlorosilane, trimethylfluorosilane, triethylfluorosilane, tripropylfluorosilane, dimethyldichlorosilane, diethyldichlorosilane, dipropyldichlorosilane, dimethyldifluorosilane, diethyldifluorosilane, dipropyldifluorosilane, ethyltrichlorosilane, propyltrichlorosilane, methyltrifluorosilane, ethyltrifluorosilane, propyltrifluorosilane, and the combination thereof.

The alkoxy silane compound may be selected from the group consisting of tetramethoxysilane, tetrapropoxysilane, methyltrimethoxysilane (MTMOS), methyltriethoxysilane (MTEOS), methyltripropoxysilane, ethyltrimethoxysilane, ethyltriethoxysilane, ethyltripropoxysilane, propyltrimethoxysilane (PrTMOS), propyltriethoxysilane (PrTEOS), propyltripropoxysilane, dimethyldimethoxysilane, dimethyldiethoxysilane, dimethyldipropoxysilane, diethyldimethoxysilane, diethyldiethoxysilane, diethyldipropoxysilane, dipropyldimethoxysilane, dipropyldiethoxysilane, dipropyldipropoxysilane, trimethylmethoxysilane, trimethylethoxysilane, trimethylpropoxysilane, triethylmethoxysilane, triethylethoxysilane, triethylpropoxysilane, tripropylmethoxysilane, tripropylethoxysilane, tripropylpropoxysilane, 3-chloropropyltrimethoxysilane, 3-aminopropyltrimethoxysilane, 3-aminopropyltriethoxysilane, [3-(2-aminoethyl)aminopropyl]trimethoxysilane, 3-mercaptopropyltrimethoxysilane, 3-methacryloxypropyltrimethoxysilane, 3-acryloxypropyltrimethoxysilane, and the combination thereof.

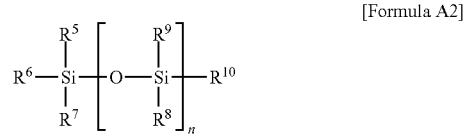
[Formula A2]

In the Formula A2, each one of $R^5$ to $R^{10}$ may be selected from the group consisting of hydrogen, halogen, ($C_1$-$C_{10}$) alkyl, ($C_1$-$C_{10}$) alkoxy, and ($C_6$-$C_{30}$) aryl. Furthermore, at least one of $R^5$ to $R^{10}$ may be one of halogen and ($C_1$-$C_{10}$) alkoxy, and n is one of integer numbers from 1 to 10.

The halogen may include fluoro, chloro, bromo, and iodo. Preferably, the halogen may be one of fluoro and chloro.

In particular, the compounds represented by the Formula A2 may include chlorodimethylsiloxy-chlorodimethylsilane, chlorodiethylsiloxy-chlorodimethylsilane, dichloromethylsiloxy-chlorodimethylsilane, dichloroethylsiloxy-chlorodimethylsilane, trichlorosiloxy-chlorodimethylsilane, fluorodimethylsiloxy-chlorodimethylsilane, difluoromethylsiloxy-chlorodimethylsilane, trifluorosiloxy-chlorodimethylsilane, methoxydimethylsiloxy-chlorodimethylsilane, dimethoxydimethylsiloxy-cholrodimethylsilane, trimethoxysiloxy-chlorodimethylsilane, ethoxydimethylsiloxy-chlorodimethylsilane, diethoxymethylsiloxy-chlorodimethylsilane, triethoxysiloxy-chlorodimethylsilane, chlorodimethylsiloxy-dichloromethylsilane, trichlorosiloxy-dichloromethylsilane, chlorodimethylsiloxy-trichlorosilane, dichloromethylsiloxy-trichlorosilane, and trichlorosiloxy-trichlorosilane.

The silane inorganic acid salts may be produced by i) adding the silane compound with the second inorganic acid and ii) inducing reaction within a temperature range from about 20° C. to about 300° C., preferably, a temperature range from about 50° C. to about 200° C. Such a process may be carried out while removing air and moisture. When a reaction temperature is lower than about 20° C., the silane compound may be crystallized or vaporized due to a comparatively low reaction rate. When a reaction temperature is higher than about 300° C., the second inorganic acid may be vaporized.

For example, about 100 part of weight of the second inorganic acid may be reacted with about 0.001 to about 50 part of weight of the silane compound. Preferably, about 0.01 to about 30 part of weight of the silane compound may be reacted with about 100 part of weight of the second inorganic acid. When the content of the silane compound is smaller than about 0.01 part of weight, it is difficult to obtain desired selectivity. When the content of the silane compound is greater than about 50 part of weight, the silane compound might be crystallized and form irregular structures.

During the reaction, volatile by-product may be generated. Such volatile by-product may be removed through distillation with decompression. Such reaction result may be distillated and the silane inorganic acid salts are isolated therefrom. The isolated silane inorganic acid salts are added into the etching composition. However, the present embodiment is not limited thereto. For example, the reaction result may be added into the etching composition without the distillation.

Such reaction may be carried out with or without an aprotic solvent. In case of using the non-protic solvent, it is preferable to use a solvent or a solvent mixture having a boiling point up to 120° C. as 10013 mbar. Such a solvent may include: i) dioxane, tetrahydrofuran, diethyl ether, diisopropyl ether, diethylene glycol methyl ether; ii) chlorinated hydrocarbons, such as dichloromethane, trichloromethane, tetrachloromethane, 1,2-dichloroethane, and trichlorethylene; iii) hydrocarbons, such as pentane, n-hexane, hexane isomer mixture, heptane, octane, benzene, petroleum ether, benzene, toluene, and xylene; iv) ketones such as acetone, methyl ethyl ketone, diisopropyl ketone, and methyl isobutyl ketone (MIBK); v) esters, such as ethyl acetate, butyl acetate, propyl propionate, ethyl butyrate ethyl isobutyrate, carbon disulphide and nitrobenzene; and a combination thereof.

As described, the silane inorganic acid salts are produced by inducing reaction between the second inorganic acid and the silane compound. Accordingly, the silane inorganic acid salts have various chemical formulas in accordance with at least one embodiment. That is, the silane inorganic acid salts may be produced by repeated and continuous reactions between the second inorganic acid and the silane compound. Such silane inorganic acid slats may have various straight-chain or branched formula structures reacted according to the number of halogen atoms and positions of the halogen atoms.

Such silane inorganic acid salts may be exemplary expressed by following Formulas. However, the present embodiments are not limited thereto.

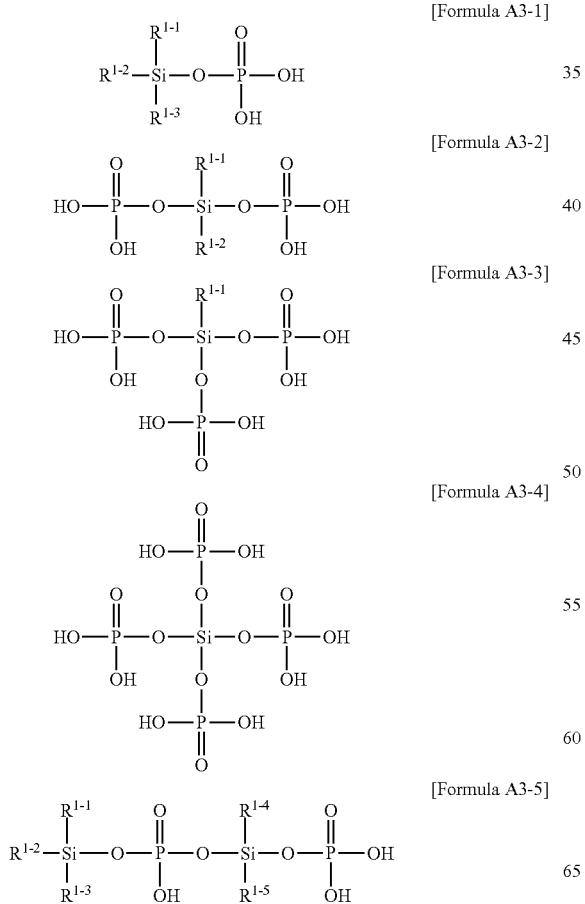

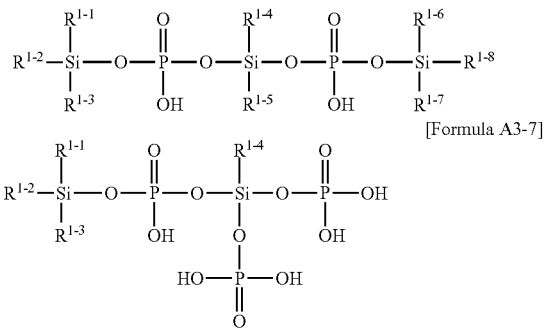

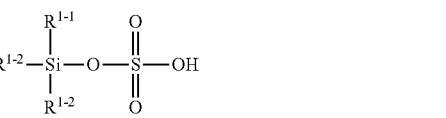

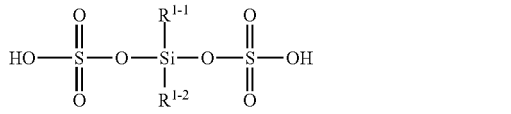

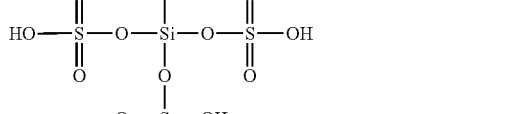

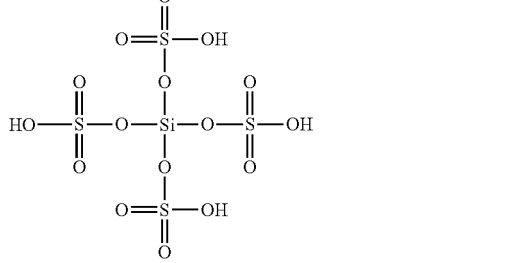

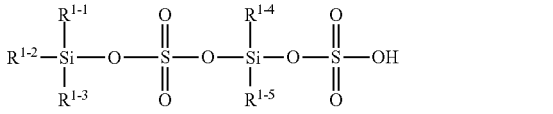

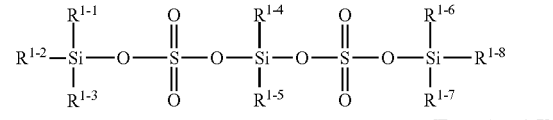

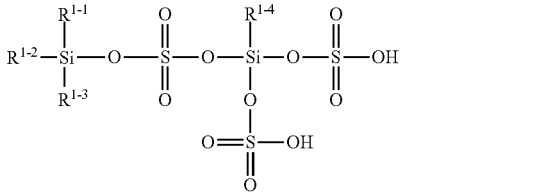

-continued

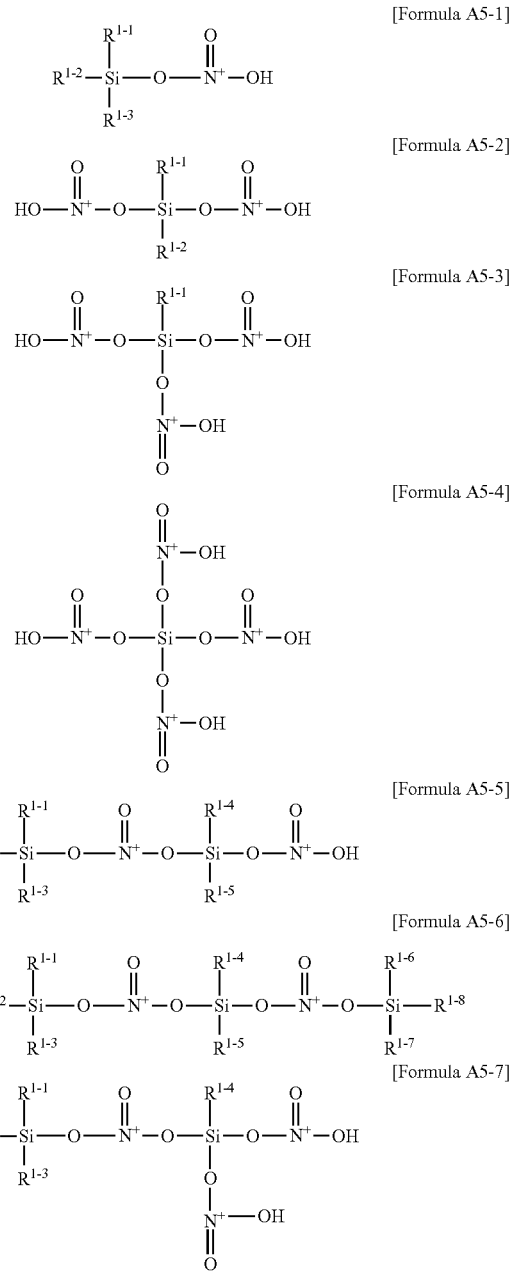

[Formula A5-1]
[Formula A5-2]
[Formula A5-3]
[Formula A5-4]
[Formula A5-5]
[Formula A5-6]
[Formula A5-7]

In the Formulas A3-1 to A3-7, A4-1 to A4-7, and A5-1 to A5-7, each one of $R^{1-1}$ to $R^{1-8}$ may be selected from the group consisting of hydrogen, halogen, ($C_1$-$C_{10}$) alkyl, ($C_1$-$C_{10}$) alkoxy, and ($C_6$-$C_{30}$) aryl. The halogen may include fluoro, chloro, bromo, and iodo. Preferably, the halogen may be one of fluoro and chloro.

The content of the silane inorganic acid salts is about 0.01 to about 15 wt %, more preferably about 0.05 to about 15 wt %, even more preferably about 1 to about 15 wt %, and more preferably about 3 to about 7 wt %, based on the total weight of the etching composition.

When the content of the silane inorganic acid salts is less than about 0.01 wt %, a high etching selectivity for a nitride layer may not be obtained. When the content of the silane inorganic acid salts is more than about 15 wt %, an increase in the content does not lead to a further increase in the etching selectivity and may cause problems such as generation of particles.

For example, when the content of the silane inorganic acid salts is more than about 0.7 wt %, a selectivity between a nitride etch rate and an oxide etch rate of the etching composition is higher than about 200:1 (e.g., nitride etch rate Å/min:oxide etch rate Å/min). For example, the selectivity of the etching composition may be about 200:1, about 200:5, and about 200:10.

For example, when the content of the silane inorganic acid salts is higher than about 1.4 wt %, the selectivity between the nitride etch rate and the oxide etch rate of the silane inorganic acid salts may be about 200:infinity (nitride etch rate:oxide etch rate). As described, the etching composition in accordance with at least one embodiment has a high selectivity for a nitride layer with respect to an oxide layer. Accordingly, the etching composition enables easy control of the etch rate of the oxide layer and easy control of the EFH.

In accordance with at least one embodiment, the silane inorganic acid slats may be produced by reacting polyphosphoric acid with silane compounds. Such silane inorganic acid slats may be represented by Formula B1 below.

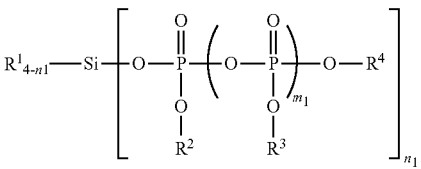

[Formula B1]

In the Formula B1, $R^1$ may be selected from the group consisting of hydrogen, halogen, ($C_1$-$C_{10}$) alkyl, ($C_1$-$C_{10}$) alkoxy, and ($C_6$-$C_{30}$) aryl. The halogen may include fluoro, chloro, bromo, and iodo. Preferably, the halogen may be one of fluoro and chloro. $n_1$ is one of integer numbers from 1 to 4, and $m_1$ is one of integer numbers from 1 to 10. Each one of $R^2$ to $R^4$ may be hydrogen. Selectively, at least one of hydrogens selected from the group consisting of $R^2$ to $R^4$ may be substituted by a substituent represented by Formula B2 below.

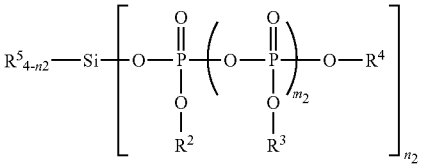

[Formula B2]

In the Formula B2, one of $R^5$ may be a coupler to Formula B1 and the others may be selected from the group consisting of hydrogen, halogen, ($C_1$-$C_{10}$) alkyl, ($C_1$-$C_{10}$) alkoxy, and ($C_6$-$C_{30}$) aryl. For example, when there are four $R^5$, one of $R^5$ is a coupler to Formula B1, each one of the remaining three $R^5$ may be selected from the group consisting of hydrogen, halogen, ($C_1$-$C_{10}$) alkyl, ($C_1$-$C_{10}$) alkoxy, and ($C_6$-$C_{30}$) aryl. For another example, when there is one $R^5$, it is a coupler to Formula B1. $n_2$ is one of integer numbers from 0 to 3, and $m_2$ is one of integer numbers from 1 to 10.

In the Formula B2, each one of $R^2$ to $R^4$ may be hydrogen or may be substituted by a substituent represented by Formula B2. That is, one of $R^2$ to $R^4$ may be substituted by a substituent represented by Formula B2. In addition, one of $R^2$ to $R^4$ of a substituent represented by a second Formula B2 may be also substituted by a substituent represented by a third Formula B2

It is because the silane inorganic acid salts are produced by reaction between the polyphosphoric acid and the silane compound. For example, a composition represented by the Formula B1 is produced by reaction between the polyphosphoric acid and the silane compound. In the produced composition represented by the Formula B1, hydroxyl group may be reacted again with the silane compound. Herein, the hydroxyl group is positioned one of $R^2$ to $R^4$ at a part induced from the polyphosphoric acid, and the silane compound is a reactant starting this repeated reaction. Continuously, the reacted silane compound is reacted again with the polyphosphoric acid. Such reaction may be repeated and continued.

As a result of repeated and continuous reaction, the following compositions of the silane inorganic acid salts may be produced In the Formula B1, $n_1$ is 1, $m_1$ is 1, $R^2$ to $R^4$ are all hydrogen. In this case, a silane inorganic acid salt represented by Formula B3-1 below may be produced. The definition of $R^{1-1}$ to $R^{1-3}$ is identical to the definition of the $R^1$.

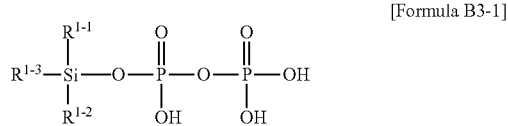

[Formula B3-1]

A composition represented by Formula B3-2 below is about identical to the composition represented by Formula B3-1 except $m_1$ is 2.

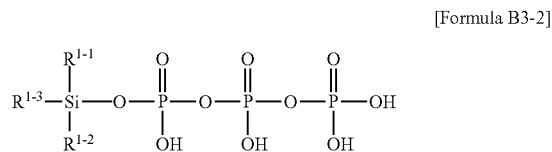

[Formula B3-2]

Formula B3-3 below exemplary expresses a compound when the Formula B1 has following conditions: i) $n_1$ is 2, ii) $m_1$ is 1, and iii) each one of $R^2$ to $R^4$ is hydrogen. The definitions of $R^{1-1}$ to $R^{1-2}$ are identical to the definition of the $R^1$.

[Formula B3-3]

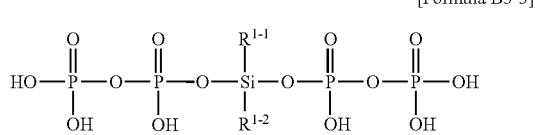

Formula B3-4 below exemplary expresses a compound when Formula B1 has followings: i) $n_1$ is 1, ii) $m_1$ is 1, iii) all of $R^2$ to $R^3$ is hydrogen, and iv) $R^4$ is substituted by a substituent expressed by the Formula B2. In the Formula B2 of the substituent, $n_2$ is 0, and at least one of $R^5$ is a coupler to Formula B1. Herein, definitions of $R^{1-1}$ to $R^{1-6}$ are identical to the definition of $R^1$.

Such a compound represented by the Formula B3-4 below is produced as a result of repeated reaction between i) a part induced from the polyphosphoric acid having a substituent of $R^4$ of the compound represented by Formula B1 and ii) the silane compound. Herein, the silane compound is a reactant starting the repeated reaction.

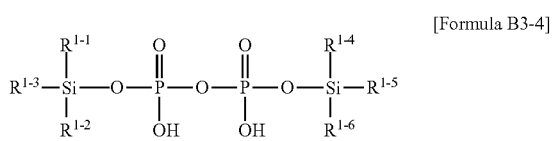

[Formula B3-4]

Formula B3-5 below exemplary represents a compound when the Formula B1 has followings: i) $n_1$ is 1, ii) $m_1$ is 1, iii) $R^3$ to $R^4$ are hydrogen, and iv) $R^2$ is substituted by Formula B2. Herein, the Formula B2 has followings: i) $n_2$ is 1, ii) $m_2$ is 1, iii) at least one of $R^5$ is a coupler to Formula B1, and iv) all of $R^2$ to $R^4$ is hydrogen. Herein, definitions of $R^{1-1}$ to $R^{1-5}$ are identical to the definition of $R^1$.

Such a compound represented by the Formula B3-5 below is produced as a result of repeated and continuous reactions. For example, i) hydroxyl group, which is positioned at the location of $R^4$ of a part induced from the polyphosphoric acid in the compound represented by Formula B1, is reacted again with the silane compound. Herein, the silane compound is a reactant starting this repeated reaction. Then, ii) the silane compound reacted with the compound represented by the Formula B1 is continuously reacted with the polyphosphoric acid. Herein, the polyphosphoric acid is a reactant starting this continues reaction.

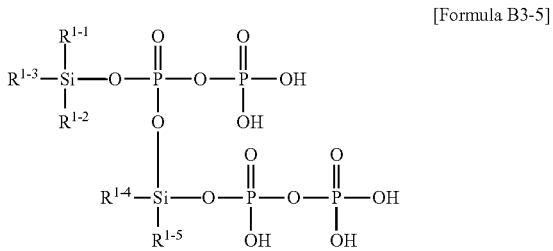

[Formula B3-5]

Formula B3-6 and Formula B3-7 below exemplary represents compounds about identical to the compound represented by the Formula B3-5 except a location of a substituent expressed by the Formula B2. In case of the Formula B3-6, the substituent expressed by the Formula B2 is positioned at a location of $R^3$ of the Formula B1. In case of the Formula B3-7, the substituent expressed by the Formula B2 is positioned at a location of $R^4$ of the Formula B1.

[Formula B3-6]

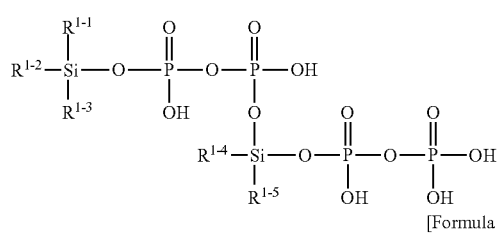

[Formula B3-7]

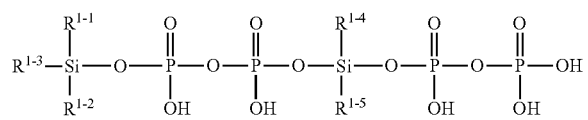

Formula B3-8 below exemplary represents a compound when the Formula B1 has following conditions: i) $n_1$ is 1, ii) $m_1$ is 1, iii) $R^2$ to $R^3$ are hydrogen, iv) $R^4$ of the Formula B1 is substituted by a first substituent expressed by the Formula B2, and v) $R^4$ of the substituent expressed by the Formula B2 is substituted by a second substituent expressed by the Formula B2. Herein, the Formula B2 has following conditions: i) $n_2$ is 1, ii) $m_2$ is 1, iii) at least one of $R^5$ is a coupler to the Formula B1, and iv) at least one of $R^2$ and $R^3$ is hydrogen. Herein, definitions of $R^{1-1}$ to $R^{1-7}$ are identical to the definition of $R^1$.

Such a compound represented by the Formula B3-8 below is produced as a result of repeated and continuous reactions. For example, i) hydroxyl group is reacted again with the silane compound. Herein, the reacted hydroxyl group is positioned at a part induced from the polyphosphoric acid at a right end of the compound represented by the Formula B3-7, and the silane compound is a reactant starting this repeated reaction. Then, ii) the silane compound reacted with the compound represented by the Formula B3-7 is continuously reacted with the polyphosphoric acid. Herein, the polyphosphoric acid is a reactant starting this continuous reaction.

[Formula B3-8]

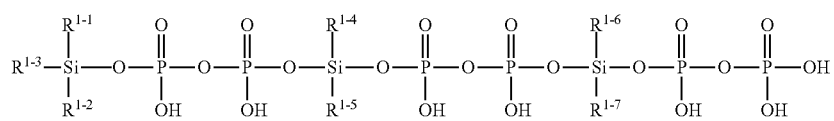

As described, various compositions expressed by the Formula B3-1 to B3-8 may be produced in accordance with at least one embodiment. However, the embodiments are not limited thereto.

As described, the silane compounds may be reacted with the polyphosphoric acid and produce silane inorganic acid salts expressed by the Formula B1 as a result of the reaction. Such silane compounds may be a compound represented by the Formula A1. Since the compounds expressed by the Formula A1 are already described, the detailed descriptions thereof are omitted herein.

The polyphosphoric acid may be a pyrophosphoric acid containing two phosphoric acid atoms or a polyphosphate containing three or more phosphoric acid atoms.

A method of producing the silane inorganic acid salts by reacting the poly phosphoric acid and the silane compound may be about identical to a method of producing silane inorganic acid salts by reacting the second inorganic acid with the silane compounds, except using the polyphosphoric acid instead of using the second inorganic acid.

In accordance with at least one embodiment, the silane inorganic acid salts may be siloxane inorganic acid salts expressed by Formula C1 below. Such siloxane inorganic acid salts may be produced by reacting a second inorganic acid and a siloxane compound. Herein, the second inorganic acid may be selected from the group consisting of phosphoric acid, anhydrous phosphoric acid, pyrophosphoric acid, polyphosphoric acid, and a combination thereof.

[Formula C1]

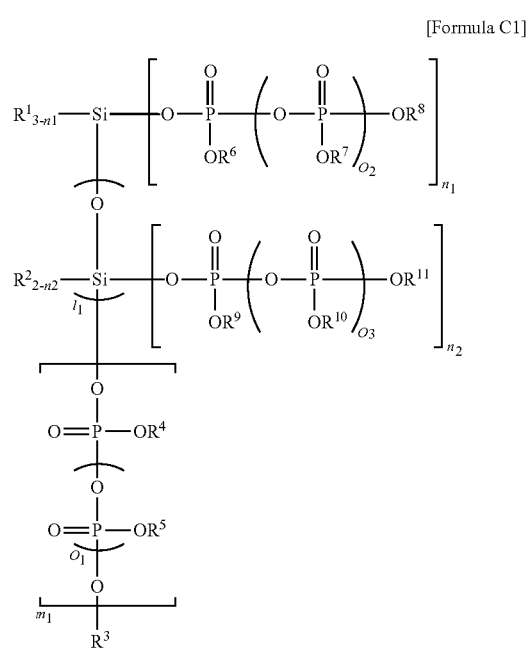

In the Formula C1, each one of $R^1$ to $R^2$ may be selected from the group consisting of hydrogen, halogen, ($C_1$-$C_{10}$) alkyl, ($C_1$-$C_{10}$) alkoxy, and ($C_6$-$C_{30}$) aryl. The halogen may include fluoro, chloro, bromo, and iodo. Preferably, the halogen may be one of fluoro and chloro.

In the Formula C1, $n_1$ is one of integer numbers from 0 to 3, $n_2$ is one of integer numbers from 0 to 2, and $m_1$ is one of integer numbers 0 and 1, wherein a sum of $n_1$, $n_2$, and $m_1$ is equal or greater than 1 (e.g., $n_1+n_2+m_1 \geq 1$). For example, the Formula C1 may include at least one of atom groups induced from the second inorganic acid such as the phosphoric acid.

In the Formula C1, $l_1$ is one of integer numbers from 1 to 10 and each one of $O_1$ to $O_3$ is one of integer numbers from 0 to 10.

In the Formula C1, each one of $R^3$ to $R^{11}$ is hydrogen. Selectively, at least one of hydrogen selected from the group consisting of $R^3$ to $R^{11}$ may be substituted by a substituent expressed by Formula C2 below.

[Formula C2]

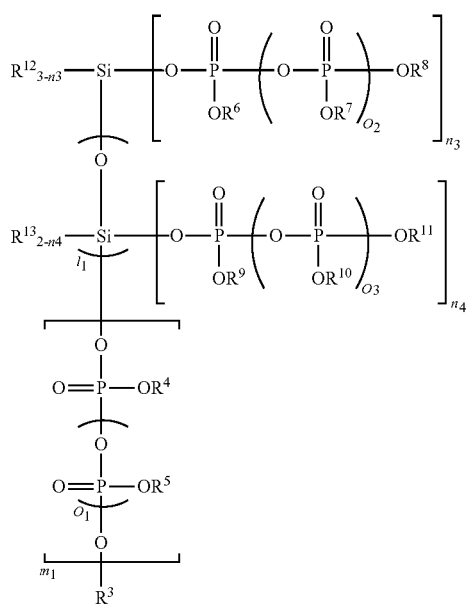

In the Formula C2, one of $R^{12}$ and $R^{13}$ may be a coupler to the Formula C1 and the others may be independently selected from the group consisting of hydrogen, halogen, $(C_1\text{-}C_{10})$ alkyl, $(C_1\text{-}C_{10})$ alkoxy, and $(C_6\text{-}C_{30})$ aryl. For example, when there are two $R^{12}$ and one $R^{13}$, one of them is a coupler to the Formula C1, each one of the remaining two may be selected from the group consisting of hydrogen, halogen, $(C_1\text{-}C_{10})$ alkyl, $(C_1\text{-}C_{10})$ alkoxy, and $(C_6\text{-}C_{30})$ aryl. For another example, when there is one $R^{12}$ and none of $R^{13}$, $R^{12}$ is a coupler to the Formula C1.

$n_3$ is one of integer numbers from 0 to 3, $n_4$ is one of integer numbers from 0 to 2, and $m_1$ is one of integer numbers from 0 to 1. $l_1$ is one of integer numbers from 1 to 10, and each one of $O_1$ to $O_3$ is one of integer numbers from 0 to 10.

In the Formula C2, $R^3$ to $R^{11}$ may be hydrogen or may be substituted by a substituent expressed by the Formula C2, referred to as second Formula C2. That is, at least one of $R^3$ to $R^{11}$ of the Formula C2 may be substituted by a substituent expressed by the second Formula C2, and at least one of $R^3$ to $R^{11}$ of the second Formula C2 may be substituted again by a substituent expressed by the Formula C2, referred to as third Formula C2.

It is because the siloxane inorganic acid salts are produced through repeated and continuous reaction the second inorganic acid and the siloxane compound. For example, a compound represented by the Formula C1 is produced through reaction between the second inorganic acid and the siloxane compound. In the produced compound represented by the Formula C1, hydroxyl group is reacted with the siloxane compound again. Herein, the siloxane compound is a reactant starting this repeated reaction, and the hydroxyl group reacted with the siloxane is positioned at locations of the $R^3$ to $R^{11}$ of a part induced from the second inorganic acid. Continuously, the siloxane compound, reacted with the produced compound expressed by the Formula C1, is reacted with the second inorganic acid again. Herein, the second inorganic acid is a reactant starting this continuous reaction. Such reactions are repeated and continued.

Following formulas exemplarily show siloxane inorganic acid salts produced as results of such repeated and continuous reactions.

Formula C1-1 below exemplary expresses a compound when the Formula C1 has following conditions: i) $n_1$ is 1, ii) $n_2$ is 0, iii) $m_1$ is 0, iv) $l_1$ is 1, v) $O_1$ to $O_3$ are 0, vi) all of $R^3$ to $R^{11}$ is hydrogen. Herein, definitions of $R^{1-1}$ to $R^{1-2}$ are identical to the definition of $R^1$, and definitions of $R^{2-1}$ to $R^{2-2}$ are identical to the definition of $R^2$.

[Formula C1-1]

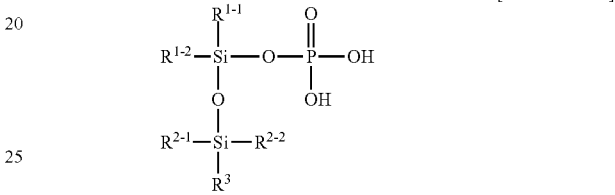

Formula C1-2 below expresses a compound about identical to the compound represented by the Formula C1-1 except when $n_2$ is 1.

[Formula C1-2]

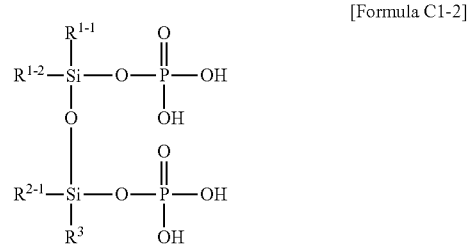

Formula C1-3 below expresses a compound that is about identical to the compound represented by the Formula C1-1 except when $O_2$ and $O_3$ are 1.

[Formula C1-3]

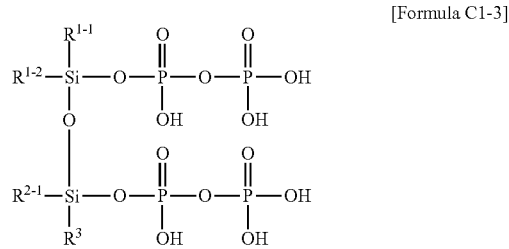

Formula C1-4 below expresses a compound that is about identical to the compound represented by the Formula C1-2 except when $l_1$ is 2.

[Formula C1-4]

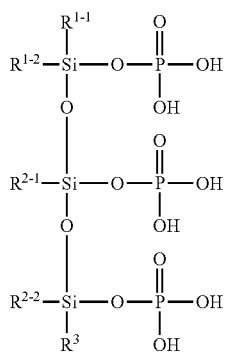

Formula C1-5 below exemplary expresses a compound when the Formula C1 has following conditions: i) $n_1$ is 2, ii) $n_2$ is 2, iii) $m_1$ is 0, iv) $l_1$ is 1, v) at least one of $O_1$ to $O_3$ is 0, vi) all of $R^3$ to $R^{11}$ is hydrogen.

[Formula C1-5]

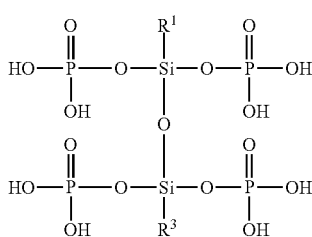

Formula C1-6 below exemplary expresses a compound when the Formula C1 has following conditions: i) $n_1$ is 1, ii) $n_2$ is 1, iii) $m_1$ is 0, iv) $l_1$ is 1, v) at least one of $O_1$ to $O_3$ is 0, vi) $R^6$, $R^9$, and $R^{11}$ are hydrogen, and vii) $R^8$ is substituted by a substituent expressed by the Formula C2. Herein, in the Formula C2 of the substituent, i) $n_3$ and $n_4$ are 0, ii) $m_1$ is 0, iii) $l_1$ is 1, and iv) at least one of $R^{12}$ is a coupler to the Formula C1.

Herein, definitions of $R^{1-1}$ to $R^{1-7}$ are identical to the definition of $R^1$, and definition of $R^{2-1}$ is identical to the definition of $R^2$. Such a compound represented by the Formula C1-6 below is produced as a result of repeated reaction between i) hydroxyl group and ii) the siloxane compound. The reacted hydroxyl group is positioned at a location of $R^8$ of a part induced from the second inorganic acid in the compound expressed by the Formula C1, and the siloxane compound is a reactant starting this repeated reaction.

[Formula C1-6]

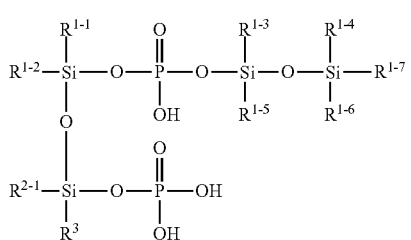

Formula C1-7 below exemplary expresses a compound when the Formula C1 has following conditions: i) $n_1$ is 1, ii) $n_2$ is 1, iii) $m_1$ is 0, iv) $l_1$ is 1, v) at least one of $O_1$ to $O_3$ is 0, vi) $R^6$, $R^9$, and $R^{11}$ are hydrogen, and vii) $R^8$ is substituted by a substituent expressed by the Formula C2. Herein, in the Formula C2 of the substituent, i) $n_3$ and $n_4$ are 1, ii) $m_1$ is 0, iii) $O_2$ and $O_3$ are 0, iv) at least one of $R^{12}$ is a coupler to the Formula C1, and v) $R^6$, $R^8$, $R^9$, and $R^{11}$ are hydrogen. Herein, definitions of $R^{1-1}$ to $R^{1-3}$, $R^{2-1}$, $R^{2-2}$, $R^{3-1}$, and $R^{3-2}$ are identical to the definitions of $R^1$, $R^2$, and $R^3$, respectively.

Such a compound represented by the Formula C1-7 below is produced as a result of repeated and continuous reactions. For example, hydroxyl group is reacted again with the siloxane compound. Herein, the reacted hydroxyl group is hydroxyl group positioned at the $R^8$ of a part induced from the second inorganic acid in the compound expressed by the Formula C1. Then, the reacted siloxane compound is continuously reacted with the second inorganic acid. Herein, the second inorganic acid is a reactant starting this continuous reaction.

[Formula C1-7]

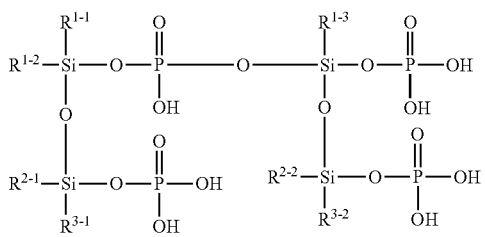

Formula C1-8 below expresses a compound that is about identical to the compound represented by the Formula C1-7 except that a substituent expressed by the Formula C2 is positioned at a location of $R^{1-3}$ of the Formula C1-7 and coupled to the Formula C1.

[Formula C1-8]

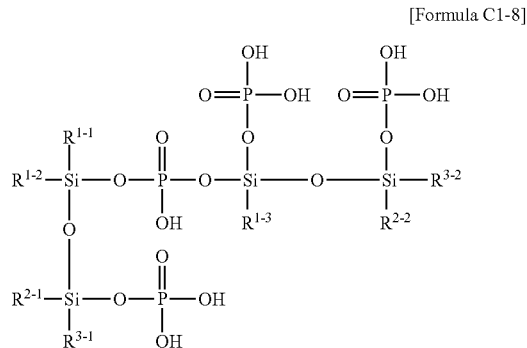

Formula C1-9 below exemplary expresses a compound when the Formula C1 has following conditions: i) $n_1$ is 1, ii) $n_2$ is 1, iii) $m_1$ is 0, iv) $l_1$ is 1, v) at least one of $O_1$ to $O_3$ is 0, vi) $R^3$, $R^6$, $R^9$, and $R^{11}$ are hydrogen, vii) $R^8$ of the Formula C1 is substituted by a first substituent expressed by the Formula C2 referred to as first Formula C2, and viii) $R^8$ of the first substituent (e.g., the first Formula C2) is substituted by a second substituent expressed by the Formula C2 referred to as second Formula C2. Herein, in the first Formula C2 of the first substituent, i) $n_3$ and $n_4$ are 1, ii) $m_1$ is 0, iii) $l_1$ is 1, iv) $O_2$ and $O_3$ are 0, v) at least one of $R^{12}$ is a coupler to the Formula C1, v) $R^6$, $R^9$, and $R^{11}$ are hydrogen, and vi) $R^8$ is the second substituent expressed by the second Formula C2. In the second Formula C2 of the second substituent, i) $n_3$ and $n_4$ are 1, ii) $m_1$ is 0, iii) $l_1$ is 1, iv) $O_2$ and $O_3$ are 0, v) at least one of $R^{12}$ is a coupler to the first Formula C2, and v) $R^6$, $R^8$, $R^9$, and $R^{11}$ are hydrogen. Herein, definitions of $R^{1-1}$ to $R^{1-4}$, $R^{2-1}$ to $R^{2-3}$, and $R^{3-1}$ to $R^{3-3}$ are identical to the definitions of $R^1$, $R^2$, and $R^3$, respectively.

Such a compound represented by the Formula C1-9 below is produced as a result of repeated and continuous reactions. For example, a part induced from the second inorganic acid at a right end of the compound expressed by the Formula C1-7 is reacted again with the siloxane compound. Then, the reacted siloxane compound is continuously reacted with the second inorganic acid. Herein, the second inorganic acid is a reactant starting this continuous reaction.

[Formula C1-9]

$$\begin{array}{c}\text{(structure of Formula C1-9)}\end{array}$$

Formula C1-10 below expresses a compound that is about identical to the compound represented by the Formula C1-9 except that a substituent expressed by the Formula C2 is positioned at a location of $R^{14}$ of the Formula C1-9 and coupled to the Formula C1.

[Formula C1-10]

$$\begin{array}{c}\text{(structure of Formula C1-10)}\end{array}$$

Compounds in accordance with embodiments are not limited to the compounds expressed by the Formulas C1-1 to C1-10.

For example, in accordance with at least one embodiment, the silane compound may be siloxane inorganic acid salts which is represented by Formula C3 below and produced by reacting a second inorganic acid and a siloxane compound. Herein, the second inorganic acid may be selected from the group consisting of sulfuric acid, fuming sulfuric acid, and a combination thereof.

[Formula C3]

$$\begin{array}{c}\text{(structure of Formula C3)}\end{array}$$

In the Formula C3, each one of $R^{21}$ and $R^{22}$ may be independently selected from the group consisting of hydrogen, halogen, ($C_1$-$C_{10}$) alkyl, ($C_1$-$C_{10}$) alkoxy, and ($C_6$-$C_{30}$) aryl. The halogen may include fluoro, chloro, bromo, and iodo. Preferably, the halogen may be one of fluoro and chloro.

In the Formula C3, $n_1$ is one of integer numbers from 0 to 3, $n_2$ is one of integer numbers from 0 to 2, and $m_1$ is one of integer numbers 0 and 1, wherein a sum of $n_1$, $n_2$, and $m_1$ is equal or greater than 1 (e.g., $n_1+n_2+m_1 \geq 1$). For example, the Formula C3 may include at least one of atom groups induced from the second inorganic acid such as the sulfuric acid.

In the Formula C3, $l_1$ is one of integer numbers from 1 to 10.

In the Formula C3, each one of $R^{23}$ to $R^{25}$ is hydrogen. Selectively, at least one of hydrogen selected from the group consisting of $R^{23}$ to $R^{25}$ may be substituted by a substituent expressed by Formula C4 below.

[Formula C4]

$$\begin{array}{c}\text{(structure of Formula C4)}\end{array}$$

In the Formula C4, one of $R^{26}$ and $R^{27}$ may be a coupler to the Formula C3 and the others may be independently selected from the group consisting of hydrogen, halogen, ($C_1$-$C_{10}$) alkyl, ($C_1$-$C_{10}$) alkoxy, and ($C_6$-$C_{30}$) aryl. For example, when there are two $R^{26}$ and one $R^{27}$, one of them is a coupler to the Formula C3, each one of the remaining two may be selected from the group consisting of hydrogen, halogen, $(C_1-C_{10})$ alkyl, $(C_1-C_{10})$ alkoxy, and $(C_6-C_{30})$ aryl. For another example, when there is one $R^{26}$ and none of $R^{27}$, $R^{26}$ is a coupler to the Formula C3.

In the Formula C4, $n_3$ is one of integer numbers from 0 to 3, $n_4$ is one of integer numbers from 0 to 2, $m_1$ is one of integer numbers from 0 to 1, and $l_1$ is one of integer numbers from 1 to 10.

In the Formula C4, $R^{23}$ to $R^{25}$ may be independent and hydrogen. $R^{23}$ to $R^{25}$ may be substituted by a substituent expressed by the Formula C4, referred to as second Formula C4. That is, at least one of $R^{23}$ to $R^{25}$ of the Formula C4 may be substituted by a substituent expressed by the second Formula C2, and at least one of $R^{23}$ to $R^{25}$ of the second Formula C4 may be substituted again by a substituent expressed by the Formula C4, referred to as third Formula C4.

Following Formulas C3-1 to C3-9 exemplarily show siloxane inorganic acid salts produced as results of the above repeated and continuous reactions, similarly to Formulas C1-1 to C1-10. In the Formulas C3-1 to C3-9, definitions of $R^{11-1}$ to $R^{11-7}$, $R^{12-1}$ to $R^{12-3}$, and $R^{13-1}$ to $R^{13-3}$ are identical to the definitions of $R^{11}$, $R^{12}$, and $R^{13}$.

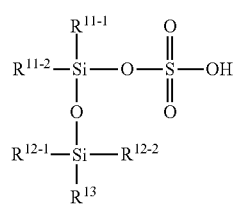

[Formula C3-1]

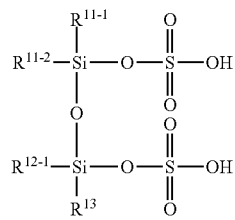

[Formula C3-2]

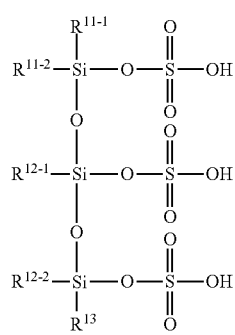

[Formula C3-3]

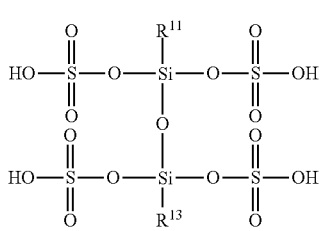

[Formula C3-4]

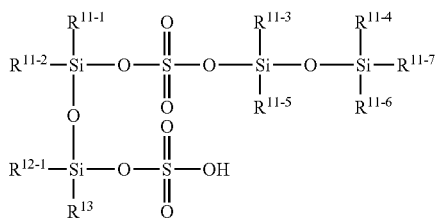

[Formula C3-5]

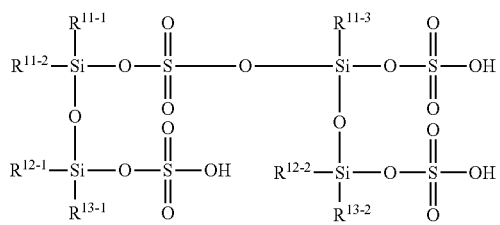

[Formula C3-6]

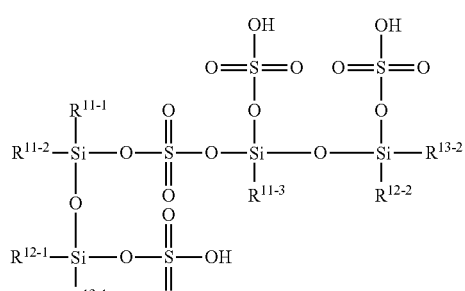

[Formula C3-7]

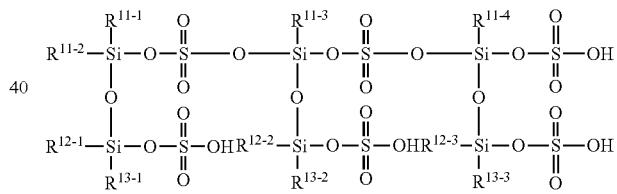

[Formula C3-8]

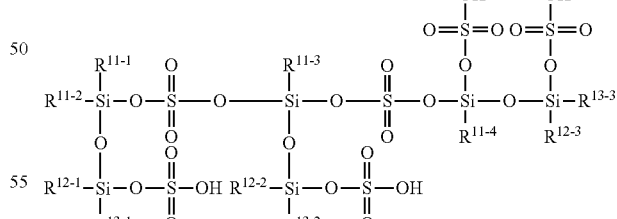

[Formula C3-9]

The compounds in accordance with at least one embodiment are not limited to the compounds expressed by the Formulas C3-1 to C3-9.

In accordance with at least one embodiment, the silane inorganic acid salts may be silane inorganic acid salts which is produced by reacting a second inorganic acid such as nitric acid and a siloxane compound. Such silane inorganic acid salts may be expressed by Formula C5 below.

[Formula C5]

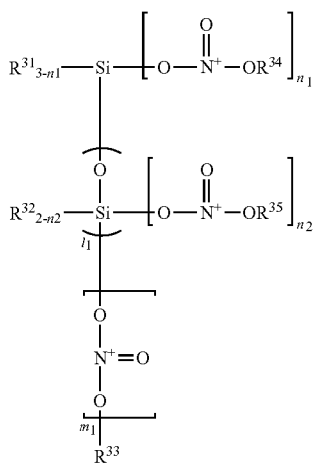

In the Formula C5, one of $R^{31}$ and $R^{32}$ may be independently selected from the group consisting of hydrogen, halogen, $(C_1\text{-}C_{10})$ alkyl, $(C_1\text{-}C_{10})$ alkoxy, and $(C_6\text{-}C_{30})$ aryl. The halogen may include fluoro, chloro, bromo, and iodo. Preferably, the halogen may be one of fluoro and chloro.

In the Formula C5, $n_1$ is one of integer numbers from 0 to 3, $n_2$ is one of integer numbers from 0 to 2, and $m_1$ is one of integer numbers 0 and 1, wherein a sum of $n_1$, $n_2$, and $m_1$ is equal or greater than 1 (e.g., $n_1+n_2+m_1 \geq 1$). For example, the Formula C5 may include at least one of atom groups induced from the second inorganic acid such as the nitric acid.

In the Formula C5, $l_1$ is one of integer numbers from 1 to 10.

In the Formula C5, each one of $R^{33}$ to $R^{35}$ is hydrogen. Selectively, at least one of hydrogen selected from the group consisting of $R^{33}$ to $R^{35}$ may be substituted by a substituent expressed by Formula C6 below.

[Formula C6]

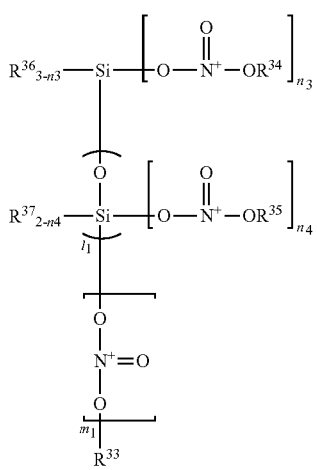

In the Formula C6, one of $R^{36}$ and $R^{37}$ may be a coupler to the Formula C5 and the others may be independently selected from the group consisting of hydrogen, halogen, $(C_1\text{-}C_{10})$ alkyl, $(C_1\text{-}C_{10})$ alkoxy, and $(C_6\text{-}C_{30})$ aryl. For example, when there are two $R^{36}$ and one $R^{37}$, one of them is a coupler to the Formula C5, each one of the remaining two may be selected from the group consisting of hydrogen, halogen, $(C_1\text{-}C_{10})$ alkyl, $(C_1\text{-}C_{10})$ alkoxy, and $(C_6\text{-}C_{30})$ aryl. For another example, when there is one $R^{36}$ and none of $R^{37}$, $R^{36}$ is a coupler to the Formula C5.

In the Formula C6, $n_3$ is one of integer numbers from 0 to 3, $n_4$ is one of integer numbers from 0 to 2, $m_1$ is one of integer numbers from 0 to 1, and $l_1$ is one of integer numbers from 1 to 10.

In the Formula C6, $R^{33}$ to $R^{35}$ may be independent and hydrogen. $R^{33}$ to $R^{35}$ may be substituted by a substituent expressed by the Formula C6, referred to as second Formula C6. That is, at least one of $R^{33}$ to $R^{35}$ of the Formula C6 may be substituted by a substituent expressed by the second Formula C6, and at least one of $R^{33}$ to $R^{35}$ of the second Formula C6 may be substituted again by a substituent expressed by the Formula C6, referred to as third Formula C6.

Following Formulas C5-1 to C5-9 exemplarily show siloxane inorganic acid salts produced as results of the above repeated and continuous reactions, similarly to the Formulas C1-1 to C1-10. In the Formulas C5-1 to C5-9, definitions of $R^{21\text{-}1}$ to $R^{21\text{-}7}$, $R^{22\text{-}1}$ to $R^{22\text{-}3}$, and $R^{23\text{-}1}$ to $R^{23\text{-}3}$ are identical to the definitions of $R^{21}$, $R^{22}$, and $R^{23}$.

[Formula C5-1]

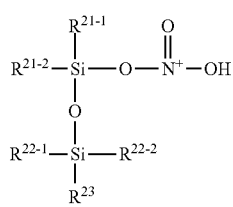

[Formula C5-2]

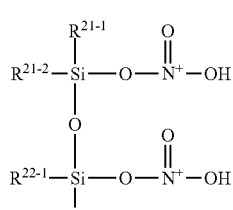

[Formula C5-3]

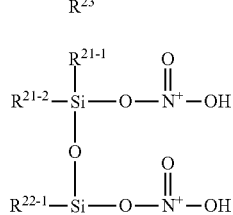

[Formula C5-4]

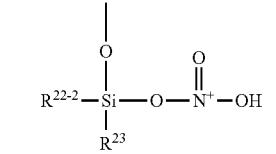

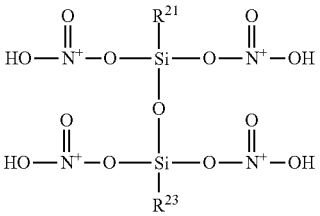

-continued

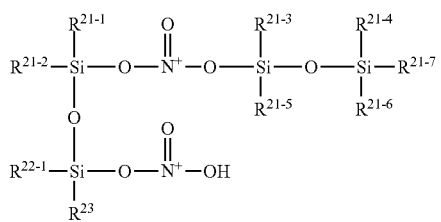

[Formula C5-5]

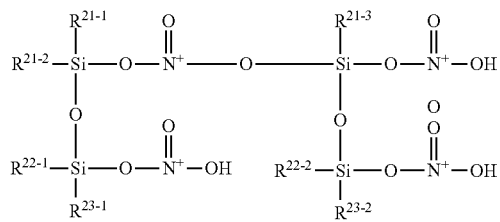

[Formula C5-6]

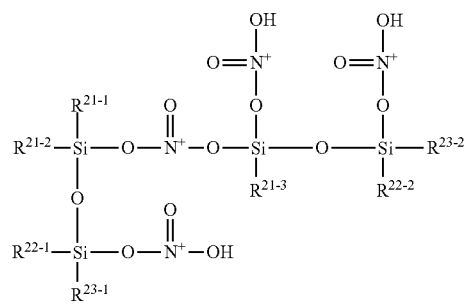

[Formula C5-7]

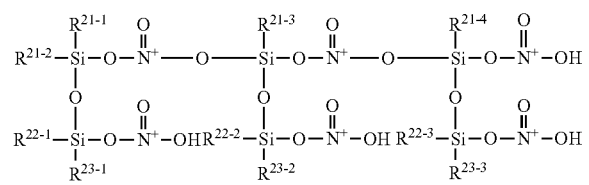

[Formula C5-8]

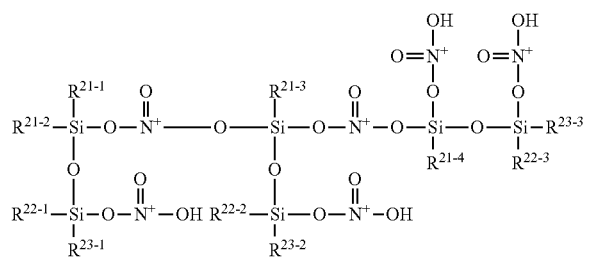

[Formula C5-9]

As described, the embodiments are not limited to the compositions exemplary expressed by the Formulas C5-1 to C5-9.

As described, in accordance with at least one embodiment, the siloxane inorganic acid salts expressed by the Formula C1 may be produced through reaction between the second inorganic acid with the siloxane compound. Such siloxane compounds may be a compound expressed by the Formula A2. Since the compound expressed by the Formula A2 is already described above, the detailed descriptions thereof are omitted herein.

A method of producing the siloxane inorganic acid salts by reacting the second inorganic acid with the siloxane compound may be about identical to a method of producing silane inorganic acid salts by reacting the second inorganic acid with the silane compound, except using the siloxane compound instead of the silane compound.

In accordance with another embodiment, a composition for etching may include a first inorganic acid, at least one of silane inorganic acid salts, and a solvent. The at least one of silane inorganic acid salts may be formed by reacting the second inorganic acid with a second silane compound.

As described, the etching composition may additionally include the second silane compound with the silane inorganic acid salts. Such additional second silane compound may be reacted with the first inorganic acid and produce additional silane inorganic acid salts during an etching process performed using the etching composition. Accordingly, the additional second silane compound may further improve selectivity for selectively removing a nitride layer while minimizing an etch rate of an oxide layer and prevention of generation of particles that badly influencing device properties. In addition, the additional second silane compound may additionally supply silane inorganic acid salts that are consumed during an etching process.

As the second silane compound, the above described silane compound may be used. Preferably, identical silane compounds, which are used for producing silane inorganic acid salts, may be used as the second silane compound. In this case, components of the second silane compound will be similar to components of the silane inorganic acid salts. Accordingly, it might further improve the affection of adding the second silane compound. Furthermore, it allows adding a reacting solution producing the silane inorganic acid salts to the etching composition without a refining process. That is, unreacted second silane compound can be effectively added into the etching composition.

The content of the second silane compound may be about 0.001 to about 15 wt %, preferably about 0.005 to about 10 wt %, more preferably about 0.01 to about 5 wt % based on the total weight of the etching composition. When the second silane compound is added less than about 0.001 wt %, it causes difficulties to control selectivity due to comparatively small content of the second silane compound. When the second silane compound is added more than about 15 wt %, it causes crystallization or generation of by-product.

The first inorganic acid is added as an etching agent for etching a nitride layer. Accordingly, the first inorganic acid may include any inorganic acid capable of etching the nitride layer. For example, the first inorganic acid may be selected from the group consisting of sulfuric acid, nitric acid, phosphoric acid, silicic acid, hydrofluoric acid, boric acid, hydrochloric acid, chloric acid, and a combination thereof.

Preferably, phosphoric acid may be used as the first inorganic acid in order to obtain an etching selectivity of the nitride layer in response to the oxide layer. The phosphoric acid may accelerate etching by providing hydrogen ions to the etching composition. In case of using the phosphoric acid as the first inorganic acid, the etching composition may further include sulfuric acid as additive. The sulfuric acid may increase a boiling point of the etching composition containing the phosphoric acid as a first inorganic acid, thereby improving etching a nitride layer.

The content of the first inorganic acid may be about 70 to 99 wt %, preferably about 70 to 90 wt %, and more preferably about 57 to about 85 wt %. When the content of the first inorganic acid is less than about 70 wt %, it might cause difficulties to effectively remove a nitride layer and generation of particles. When the content of the first inorganic acid is more than about 99 wt %, it may be difficult to obtain high selectively for a nitride layer.

As described, the etching composition may include solvent. In particular, the solvent may include water and deionized water.

The etching composition may further include an ammonium based compound. The content of the ammonium based compound may be about 0.01 to about 20 wt %. The ammonium based compound included in the etching composition may prevent decrease of an etching rate and variation of selectivity although the etching composition is used in comparatively long time. In addition, the ammonium based compound may constantly sustain the etching rate.

When the content of the ammonium based compound is less than about 0.01 wt %, the advantageous effect of sustaining the selectivity may be deteriorated. When the content of the ammonium based compound is more than about 20 wt %, an etching rate between a nitride layer and a silicon oxide layer is changed. Accordingly, the selectivity may be changed.

The ammonium based compound may be selected from the group consisting of ammonium hydroxide, ammonium chloride, ammonium acetate, ammonium phosphate, ammonium peroxydisulfate, ammonium sulfate, ammonium hydrofluoric acid salt, and a combination thereof. However, the ammonium based compound is not limited thereto. For example, the ammonium based compound may include compounds containing ammonium ion. For example, the ammonium based compound may include $NH_4$ and HCl.

The etching composition may further include fluoride based compound. The content of the fluoride based compound may be about 0.01 to about 1 wt %. When the content of the fluoride based compound is less than about 0.01 wt %, it may decrease an etching rate of a nitride layer. Accordingly, it is difficult to remove a nitride layer. When the content of the fluoride based compound is more than about 1 wt %, the etching rate of the nitride layer may be significantly improved. However, an oxide layer may be etched unexpectedly.

The fluoride based compound may be selected from the group consisting of hydrogen fluoride, ammonium fluoride, ammonium hydrogen fluoride, and a combination thereof. Preferably, the ammonium hydrogen fluoride may be used because it might improve sustaining selectivity although the etching composition is used in a comparatively long time.

In addition, the etching composition of the present embodiment may further comprise any additive that is generally used in the art, in order to improve the etching performance thereof. Examples of an additive that may be used in the present embodiment include surfactants, sequestering agents, anti-corrosive agents and the like.

The etching composition of the present embodiment, comprising the silane inorganic acid salts, shows a significantly high etching selectivity for a nitride layer with respect to an oxide layer, and thus may be used in a process for etching a nitride layer.

Thus, in the nitride film etching process employing the etching composition of the present embodiment, the EFH may be easily controlled by minimizing the etch rate of an oxide film. In addition, in the process of selectively etching and removing of a nitride film using the etching composition, the deterioration in electrical properties caused by damage to an oxide film or etching of the oxide film may be prevented, and particles are not generated, which results in improvement of device properties.

In accordance with another aspect of embodiments, a method for fabricating a semiconductor device may be provided to include an etching process carried out using the etching composition of the present embodiment.

In one exemplary embodiment, this etching process may include etching a nitride layer. Particularly, the etching process may include selectively etching a nitride film with respect to an oxide film.

The nitride layer may include SiN films, SiON films and the like.

In addition, an oxide film may be at least one film selected from the group consisting of silicon oxide films, for example, SOD (spin-on-dielectric) films, HDP (high-density plasma) films, thermal oxide films, BPSG (borophosphate silicate glass) films, PSG (phosphosilicate glass) films, BSG (borosilicate glass) films, PSZ (polysilazane) films, FSG (fluorinated silicate glass) films, LPTEOS (low-pressure tetraethylorthosilicate) films, PETEOS (plasma-enhanced tetraethylorthosilicate) films, HTO (high-temperature oxide) films, MTO (medium-temperature oxide) films, USG (undopped silicate glass) films, SOG (spin-on-glass) films, APL (advanced planarization layer) films, ALD (atomic layer deposition) films, plasma-enhanced oxide films, O3-TEOS (O3-tetraethylorthosilicate) films, and combinations thereof.

An etching process employing the etching composition of the present embodiment may be performed by a wet-etching method known in the art, for example, a dipping method or a spray method.

The etching process may be carried out at a temperature range between about 50° C. and about 300° C. and preferably about 100° C. and about 200° C. The temperature of the etching process may be suitably changed in view of other processes and other factors.

In the method for fabricating a semiconductor device, including the etching process that is carried out using the etching composition of the present embodiment, a nitride film may be selectively etched from a structure in which a nitride film and an oxide film are stacked alternately or present together. In addition, particle generation, which was problematic in the typical etching process, may be prevented, thereby ensuring process stability and reliability.

Accordingly, this method may be efficiently applied to various semiconductor fabrication processes in which a nitride film is required to be selectively etched with respect to an oxide film.

Figure 2A:
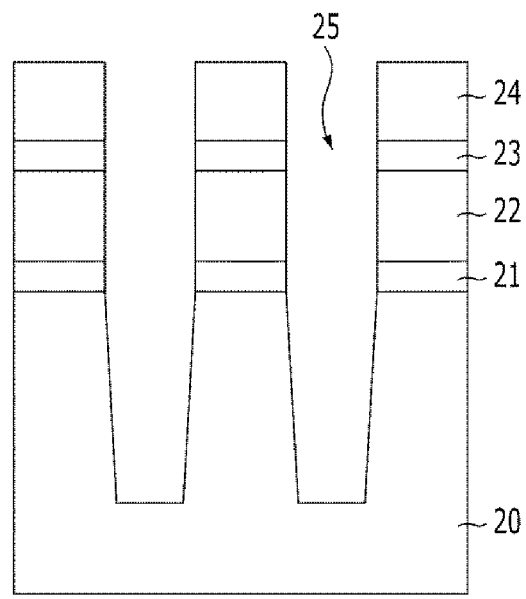
FIG. 2A to FIG. 2C are cross-sectional views showing a device isolation process for a flash memory device in accordance with at least one embodiment.
Figure 2B:
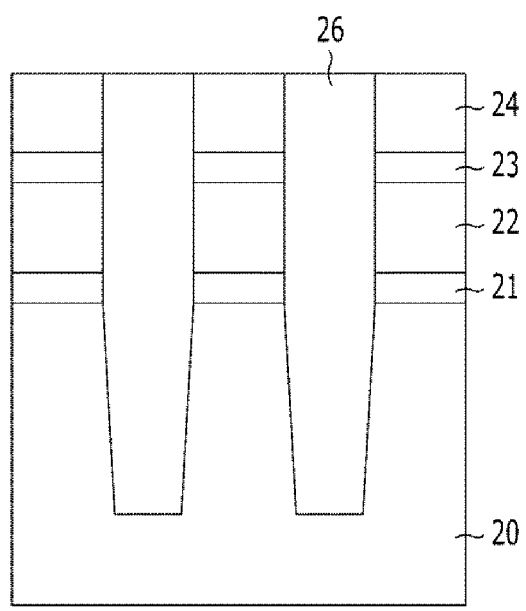
Figure 2C:
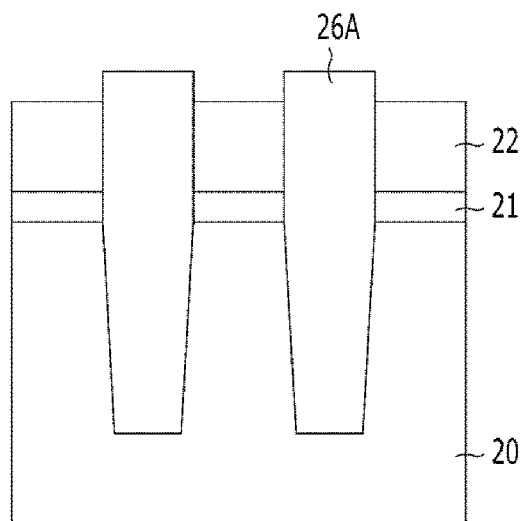

FIG. 2A to FIG. 2C are cross-sectional views showing a device isolation process for a flash memory device in accordance with at least one embodiment. Herein, the device isolation process may include an etching process employing an etching composition (e.g., a high-selectivity etching composition) according to the present embodiments.

Referring to FIG. 2A, in at least one embodiment, tunnel oxide layer 21, polysilicon layer 22, buffer oxide layer 23 and/or pad nitride layer 24 may be formed on substrate 20. For example, in some embodiments, tunnel oxide layer 21, polysilicon layer 22, buffer oxide layer 23 and/or pad nitride layer 24 may be sequentially formed on substrate 20.

Pad nitride layer 24, buffer oxide layer 23, polysilicon layer 22 and/or tunnel oxide layer 21 may be selectively etched by photolithography and etching processes to expose device isolation regions of substrate 20. Then, the exposed regions of substrate 20 may be selectively etched using pad nitride layer 24 as a mask to form at least one trench 25 having a predetermined depth from a surface of substrate 20.

Referring to FIG. 2B, oxide layer 26 may be formed on an entire surface of substrate 20 so as to gap-fill at least one trench 25. For example, oxide layer 26 may be formed by a chemical vapor deposition (CVD).

A chemical mechanical polishing (CMP) process may be performed on oxide layer 26 using pad nitride layer 24 as a polishing stop layer. Then, a cleaning process may be performed using a dry etching.

Referring to FIG. 2C, pad nitride layer 24 may be selectively removed by a wet-etching process using an etching composition according to the present embodiment, and then buffer oxide layer 23 may be removed by a cleaning process, thereby forming a device isolation layer 26A in a field region.

As shown in FIG. 2C, in at least one embodiment, a high-selectivity etching composition having a high etching selectivity for a nitride layer with respect to an oxide layer may be used. When the high-selectivity etching composition is used, the nitride layer may be selectively removed for a sufficient time while the etching of the oxide layer gap-filled in an STI pattern is minimized. In this case, such selective removal of the nitride layer may be completely performed. Accordingly, in the present embodiments using the high-selectivity etching composition, an effective field oxide height (EFH) may be easily controlled. Furthermore, in the present embodiments using the high-selectivity etching composition, an electrical characteristic deterioration and a particle generation caused by damage to an oxide layer or etching of the oxide layer may be prevented, thereby improving device characteristics.

As described above, a high-selectivity etching composition according to the present embodiments may be applied to a device isolation process for a flash memory device, but is not limited thereto. For example, a high-selectivity etching composition according to the present embodiments may be applied to a device isolation process for a DRAM device.

FIG. 3A to 3F are cross-sectional views showing a process of forming channels for a flash memory device in accordance with at least one embodiment. Herein, the channel forming process may include an etching process employing an etching composition (e.g., a high-selectivity etching composition) according to the present embodiments.

Figure 3A:
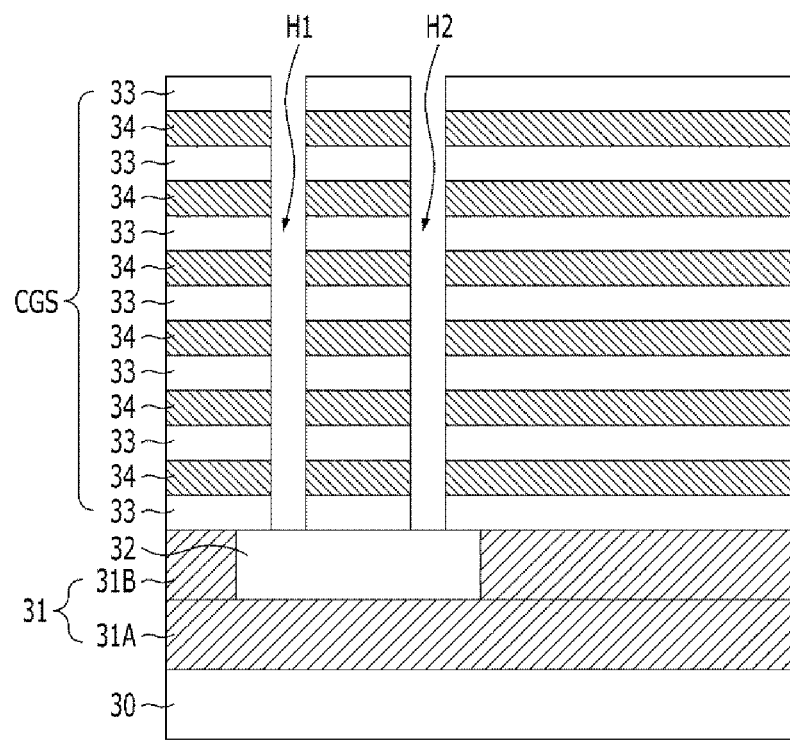
FIG. 3A to 3F are cross-sectional views showing a process of forming channels for a flash memory device in accordance with at least one embodiment.

Referring to FIG. 3A, in at least one embodiment, pipe gate electrode layer 31 may be formed on substrate 30. In this case, nitride layer 32 for forming a pipe channel may be buried in pipe gate electrode layer 31. Herein, pipe gate electrode layer 31 includes first conductive layer 31A and/or second conductive layer 31B. For example, at least one of first conductive layer 31A and second conductive layer 31B may include an impurity-doped polysilicon.

More specifically, first conductive layer 31A is formed on substrate 30, and a nitride layer is deposited on first conductive layer 31A and is patterned to form nitride layer 32 for forming at least one pipe channel. Subsequently, second conductive layer 31B is formed on first conductive layer 31A exposed through nitride layer 32. First conductive layer 31A and/or second conductive layer 31B form pipe gate electrode layer 31.

In order to form a plurality of memory cells that are vertically stacked, at least one first interlayer insulating layer 33 and at least one first gate electrode layer 34 may be alternately stacked as shown in FIG. 3A. Hereinafter, for the convenience of descriptions, the alternating stack structure of at least one first interlayer insulating layer 33 and at least one first gate electrode layer 34 will be referred to as "a cell gate structure (CGS)."

Herein, at least one first interlayer insulating layer 33 may serve to separate memory cells through a plurality of layers. For example, in at least one embodiment, at least one first interlayer insulating layer 33 may comprise an oxide layer, and at least one first gate electrode layer 34 may comprise an impurity-doped polysilicon. As shown in FIG. 3A, at least one first interlayer insulating layer 33 and/or at least one first gate electrode layer 34 are shown to consist of six layers, but are not limited thereto.

The cell gate structure (CGS) may be selectively etched to form at least one hole that exposes nitride layer 32. For example, the cell gate structure (CGS) may be selectively etched to form a pair of first and second holes H1 and H2 that expose nitride layer 32. Herein, the first and second holes H1 and H2 may be regions for forming channels for memory cells.

Figure 3B:
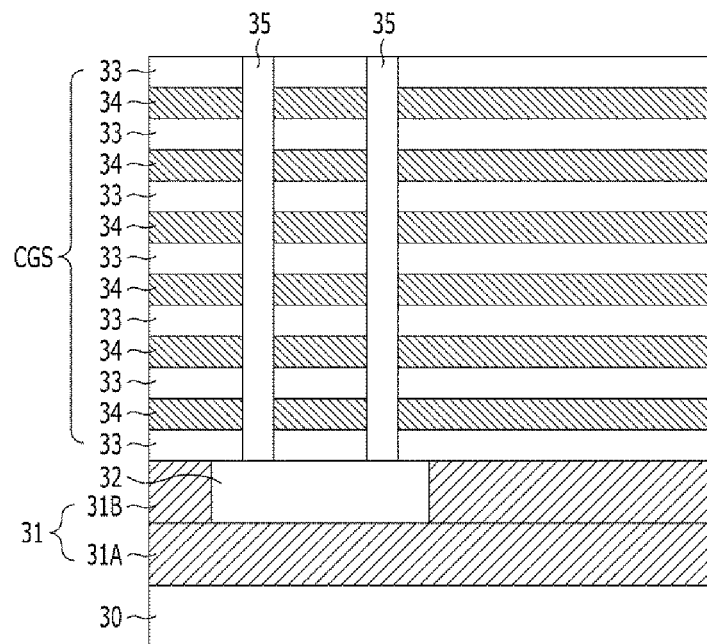

Referring to FIG. 3B, at least one nitride layer 35 which is buried in the first and second holes H1 and H2 may be formed. In this case, at least one nitride layer 35 may serve to prevent damages occurring in a trench formation process (described later in FIG. 3C) when at least one first gate electrode layer 34 is exposed through the first and second holes H1 and H2.

Figure 3C:
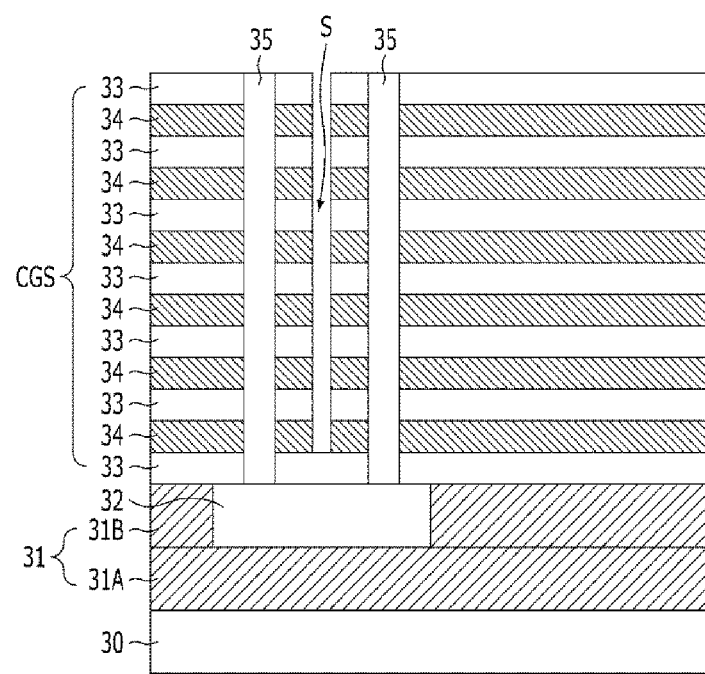

Referring to FIG. 3C, in order to separate at least one first gate electrode layer 34 into portions corresponding to each of the first and second holes H1 and H2, a trench "S" may be formed by selectively etching a cell gate structure (CGS) between a pair of the first and second holes H1 and H2.

Figure 3D:
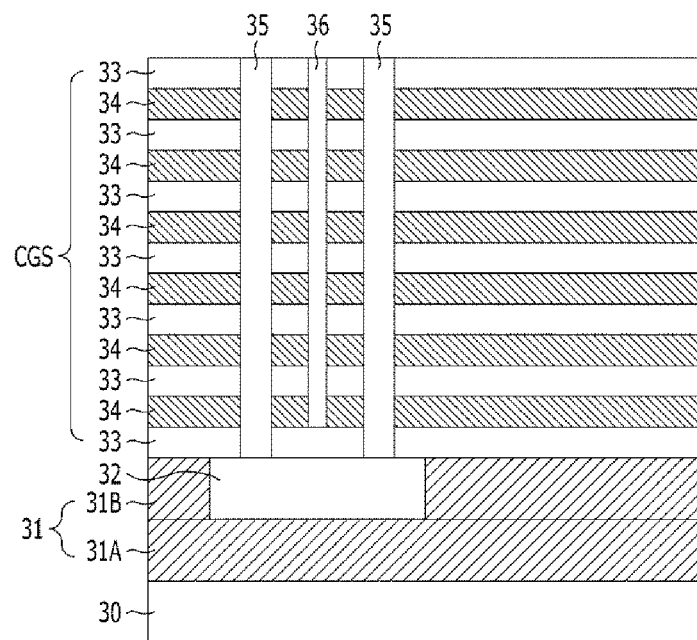

Referring to FIG. 3D, sacrificial layer 36 which is buried in the trench "S" may be formed.

Figure 3E:
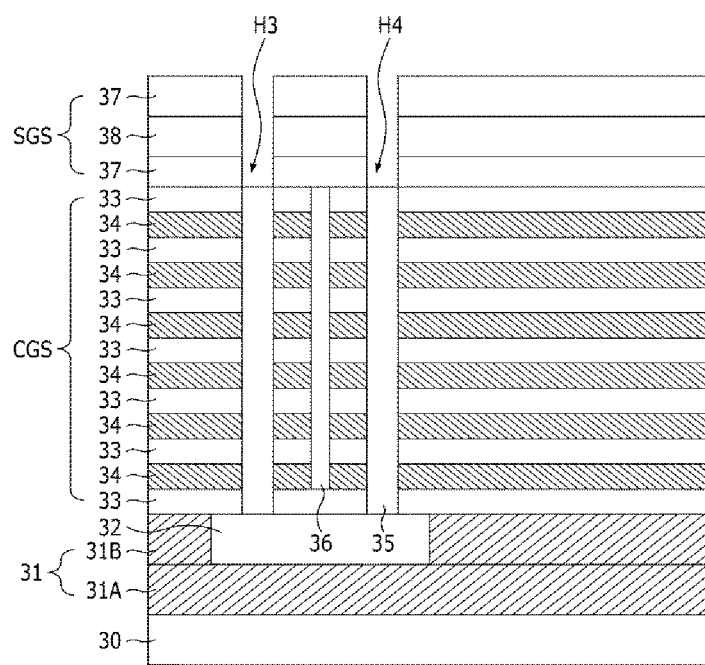

Referring to FIG. 3E, in at least one embodiment, for formation of a selection transistor, at least one second interlayer insulating layer 37 and at least one second gate electrode layer 38 may be sequentially formed on the structure (e.g., a structure shown in FIG. 3D) resulting from the above process (e.g., a process described in connection with FIG. 3A to FIG. 3D). For example, as shown in FIG. 3E, a second interlayer insulating layer 37, a second gate electrode layer 38, and another second interlayer insulating layer 37 may be sequentially formed. Hereinafter, for the convenience of descriptions, a stack structure of at least one second interlayer insulating layer 37 and at least one second gate electrode layer 38 will be referred to as "a selection gate structure (SGS)."

For example, in at least one embodiment, the at least one second interlayer insulating layer 37 may comprise an oxide layer, but is not limited thereto. The at least one second gate electrode layer 38 may comprise an impurity-doped polysilicon, but is not limited thereto.

The selection gate structure (SGS) may be selectively etched to form at least one hole that exposes nitride layer 35 buried in a pair of the first and second holes H1 and H2. For example, the selection gate structure (SGS) may be selectively etched to form third and fourth holes H3 and H4 that expose nitride layer 35 buried in a pair of the first and second holes H1 and H2. Herein, the third and fourth holes H3 and H4 may be regions in which channels for selection transistors are to be formed.

Figure 3F:
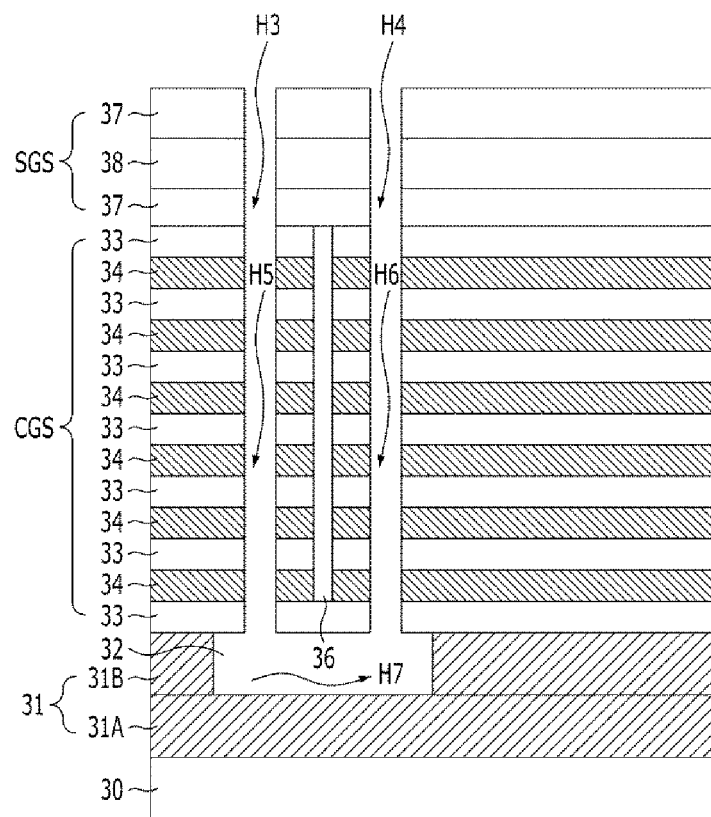

Referring to FIG. 3F, (i) nitride layer 35 exposed through the third and fourth holes H3 and H4 and (ii) nitride layer 32 disposed below nitride layer 35 may be selectively removed by a wet-etching process using an etching composition according to the present embodiments.

In the case that a process of forming channels for a flash memory (including an etching process) according to the present embodiments is performed, at least one channel hole (e.g., a pair of channel holes H5 and H6) for forming channel layers of memory cells may be formed. Furthermore, at least one pipe channel hole (e.g., H7) may be formed below the channel holes H5 and H6 such that the channel holes H5 and H6 are connected to each other. In a process of forming channels for a flash memory (including an etching process)

according to the present embodiments, nitride layers may be selectively removed for a sufficient time without loss of oxide layers by using a high-selectivity etching composition, and thus the pipe channel(s) may be accurately formed without a profile loss. In this case, such selective removal of the nitride layers may be completely performed. In addition, in a process of forming channels for a flash memory (including an etching process) according to the present embodiments, a typical problem such as a particle generation may be prevented, and thus the stability and reliability of the process may be ensured.

Then, such subsequent processes as a process of forming a floating gate and a process of forming a control gate may be performed, thereby forming a flash memory device.

Figure 4A:
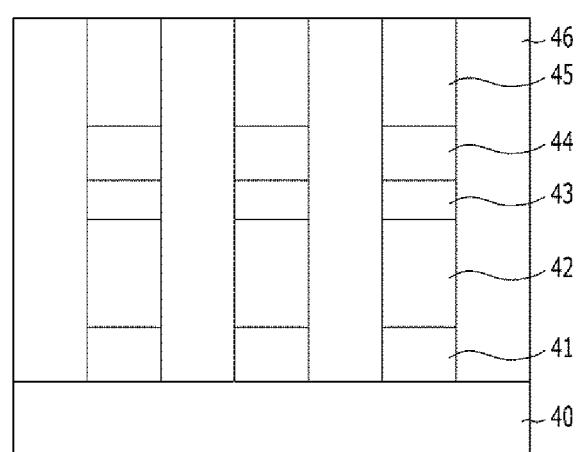
FIGS. 4A and 4B are cross-sectional views illustrating a process of forming a diode for a phase-change memory device in accordance with at least one embodiment.
Figure 4B:
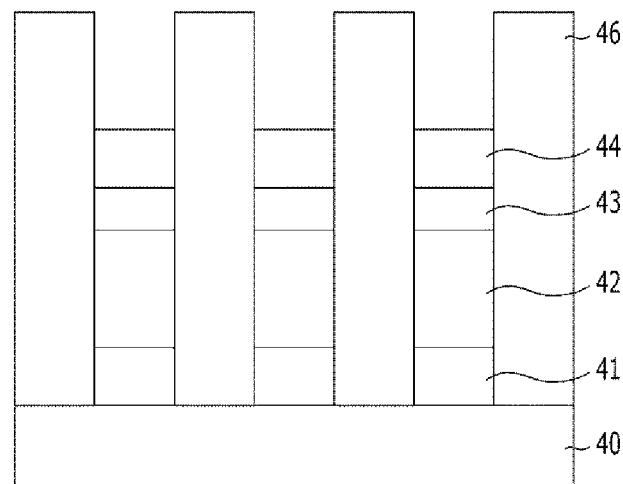

FIGS. 4A and 4B are cross-sectional views illustrating a process of forming a diode for a phase-change memory device in accordance with at least one embodiment. Herein, the diode forming process may include an etching process employing an etching composition (e.g., a high-selectivity etching composition) according to the present embodiments.

Referring to FIG. 4A, in at least one embodiment, an insulating structure may be provided on substrate 40. Herein, the insulating structure may include holes exposing conductive region 41. For example, conductive region 41 may be an n$^+$ impurity region, but is not limited thereto.

Polysilicon layer 42 may be formed so as to fill portions of the holes, followed by ion implantation of impurities, thereby forming diodes.

Titanium silicide layer 43 may be formed on polysilicon layer 42. For example, titanium silicide layer 43 may be formed by forming a titanium layer and heat-treating the formed titanium layer so as to react with polysilicon layer 42.

Titanium nitride layer 44 and nitride layer 45 may be sequentially formed on titanium silicide layer 43. For example, titanium nitride layer 44 may be formed on titanium silicide layer 43, and then nitride layer 45 may be formed on titanium nitride layer 44.

Oxide layer 46 may be formed in an isolated space between the diodes which are formed by performing a dry etching process using a hard mask. Then, a chemical mechanical polishing (CMP) process may be performed to form a primary structure of bottom electrodes isolated from each other.

Referring to FIG. 4B, nitride layer 45 may be selectively removed by performing a wet-etching process on the structure (e.g., a structure shown in FIG. 4A) resulting from the above process described in connection with FIG. 4A. Herein, the wet-etching process may be performed using an etching composition (e.g., a high-selectivity etching composition) according to the present embodiments. In at least one embodiment, the high-selectivity etching composition may be used to remove a nitride layer. In this case, the nitride layer may be selectively removed for a sufficient time without loss of an oxide layer. Such selective removal of the nitride layer may be completely performed. Furthermore, in the present embodiments using the high-selectivity etching composition, an electrical characteristic deterioration and a particle generation caused by damage to an oxide layer or etching of the oxide layer may be prevented, thereby improving device characteristics. A titanium may be deposited in the spaces remaining after removal of nitride layer 45, thereby forming bottom electrodes.

As described above, an etching process using a high-selectivity etching composition according to the present embodiments may be applied to a variety of semiconductor device-fabricating methods. For example, such etching process according to the present embodiments may be applied to processes in which selective removal of a nitride layer is required. More specifically, such etching process according to the present embodiments may be applied to processes in which a nitride layer is required to be selectively etched from a structure in which nitride layers and oxide layers are stacked alternately or present together.

Hereinafter, embodiments of the present disclosure will be described in further detail with reference to examples and comparative examples. It is to be understood, however, that these examples are illustrative purposes and are not intended to limit the scope of the embodiments of the present disclosure.

First Embodiment A: Manufacturing Etching Composition

In the first embodiment A, an etching composition may be produced by mixing at least one of silane inorganic acid salts and phosphoric acid with predetermined weight ratios as shown in Table 1A below. As a first inorganic acid, a 85% aqueous solution is used.

TABLE 1A

| | 1st | | Silane Inorganic Acid Salts (SIAS) | | | |
|---|---|---|---|---|---|---|
| | IA PA wt % | wt % | Silane Compound (SC) | 2nd IA | Weight ratio (2nd IA:SC) | PT (° C.) |
| Example A1 | 85 | 1 | SC expressed by Formula A1, wherein R$^1$ is methyl and R$^2$ to R$^4$ are chloro. | Phosphoric acid (PA) | 20:100 | 70 |
| Example A2 | 83 | 1 | SC expressed by Formula A1, wherein R$^1$ to R$^4$ are ethoxyl. | Phosphoric acid (PA) | 5:100 | 90 |
| Example A3 | 84 | 1 | SC expressed by Formula A1, wherein R$^1$ is methyl and R$^2$ to R$^4$ are chloro. | Sulfuric acid (SA) | 10:100 | 70 |
| Example A4 | 83 | 1 | SC expressed by Formula A1 where R$^1$ to R$^4$ are ethoxyl. | Sulfuric acid (SA) | 20:100 | 40 |

TABLE 1A-continued

| | 1st IA PA wt % | Silane Inorganic Acid Salts (SIAS) | | | |
|---|---|---|---|---|---|
| | | wt % | Silane Compound (SC) | 2nd IA | Weight ratio (2nd IA:SC) | PT (° C.) |
| Example A5 | 83 | 1 | SC expressed by Formula A1 where $R^1$ is methyl and $R^2$ to $R^4$ are chloro. | Nitric acid (NA) | 10:100 | 50 |
| Example A6 | 85 | 3 | SC expressed by Formula A1 where $R^1$ to $R^4$ are ethoxyl. | Nitric acid (NA) | 10:100 | 40 |

Figure 5:
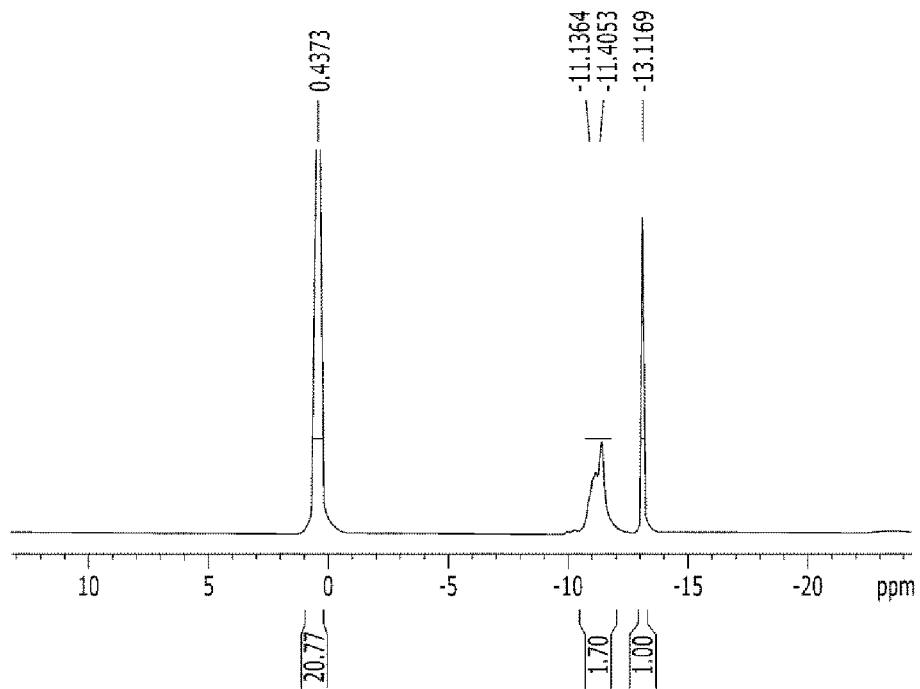
FIG. 5 is a graph showing nuclear magnetic resonance (NMR) data of silane inorganic acid slats produced according to the first embodiment A.

1) 1st IA: first inorganic acid
2) 2nd IA: second inorganic acid
3) PA: phosphoric acid FIG. 5 is a graph showing nuclear magnetic resonance (NMR) data of silane inorganic acid salts produced according to the first embodiment A.

Referring to FIG. 5, the graph shows that at least one of silane inorganic acid salts in an etching composition in accordance with at least one embodiment. That is, a compound expressed by the Formula A1 where $R^1$ is methyl and $R^2$ to $R^4$ are chloro is reacted with phosphoric acid (e.g., the second inorganic acid). As a result, the at least one of the silane inorganic acid salts may be produced. That is, the graph of FIG. 5 includes broad peaks at about 11.1364 ppm and about 11.4053 ppm, which are different from a sharp peak that indicates a single compound. Accordingly, such broad peaks indicate the etching composition includes a plurality of silane inorganic acid salts having various formulas.

Experimental Example A1: Measure Selectivity of Etching Composition

Using the etching composition of the present embodiment, etching for a nitride layer and an oxide layer was carried out at a process temperature of 157° C. Etch rate and selectivity for the nitride layer and the oxide layer were measured using an ellipsometer (NANO VIEW, SEMG-1000) that is a film thickness measurement system. The results of the measurement are shown in Table A2 below. The etch rate was determined by etching each of the layers for about 300 seconds and measuring the difference between the thickness of each layer before etching and the layer thickness of each layer after etching. Thus, the etch rate is obtained by dividing the thickness difference by the etching time (minute). The etching selectivity is expressed as the ratio of the etch rate of the nitride layer to that of the oxide layer.

TABLE A2

| | Process temperature (° C.) | Etch rate (Å/min) of nitride layer | Etch rate (Å/min) of oxide layer | | | Selectivity | |
|---|---|---|---|---|---|---|---|
| | | | $ThO_x$[1] | LP-TEOS[2] | BPSG[3] | LP-TEOS | BPSG |
| Example A1 | 157 | 58.24 | 0.30 | 0.21 | 0.76 | 277.33 | 76.63 |
| Example A2 | 157 | 58.73 | 0.26 | 0.18 | 1.08 | 326.28 | 54.38 |
| Example A3 | 157 | 58.21 | 0.29 | 0.22 | 0.93 | 264.59 | 62.59 |
| Example A4 | 157 | 58.27 | 0.70 | 0.11 | 0.89 | 529.73 | 65.47 |
| Example A5 | 157 | 58.91 | 0.30 | 0.122 | 0.86 | 482.87 | 68.50 |
| Example A6 | 157 | 58.81 | 0.25 | 0.07 | 1.14 | 840.14 | 51.59 |

[1]ThO: thermal oxide layer
[2]LP-TEOS: Low Pressure Tetra Ethyl Ortho Silicate layer
[3]BPSG: Borophosphate Silicate Glass layer Comparative Examples A1 to A3: Manufacturing Etching Composition In Comparative Example A1, etching was carried out using phosphoric acid at a process temperature of 157° C. Etch rate and etching selectivity were measured in the same manner as the above Examples. In Comparative Example 2, etching was carried out using a mixture of 0.05% hydrofluoric acid and phosphoric acid mixed at a low temperature of 130° C. In Comparative Example A3, etching was carried out using the same mixture as that of Comparative Example A2 at a process temperature of 157° C. In Comparative Examples A2 and A3, the etch rate and selectivity were measured in the same manner as the above Examples. The phosphoric acid used in Comparative Examples A1 to A3 was a 85% aqueous solution of phosphoric acid. The results of measurement in Comparative Examples A1 to A3 are shown in Table A3 below.

TABLE A3

| Etching composition | Process temp. (° C.) | Etch rate (Å/min) of nitride layer | Etch rate (Å/min) of oxide layer | | Selectivity | |
|---|---|---|---|---|---|---|
| | | | ThOx | LP-TEOS | BPSG | LP-TEOS | BPSG |
| Comp. Example A1 | Phosphoric acid | 157 | 61.32 | 1.1 | 13.19 | 9.85 | 4.64 | 6.23 |
| Comp. Example A2 | Phosphoric acid + Hydrofluoric acid (0.05 wt %) | 130 | 15.44 | 0 | 2.3 | 1.03 | 6.71 | 14.99 |
| Comp. Example A3 | Phosphoric acid + Hydrofluoric acid (0.05 wt %) | 157 | 76.12 | 5.67 | 32.14 | 20.48 | 2.36 | 3.71 |

As can be seen in Table A2 and Table A3, the etching compositions showed a significantly high etching selectivity for the nitride layer with respect to the oxide layer compared to those of Comparative Examples A1 to A3. Thus, when the high-selectivity etching composition of the present embodiment is used, the EFH may be easily controlled by controlling the etch rate of the oxide layer, and damage to the oxide layer may be prevented. In addition, particle generation, which was problematic, may be prevented, thus ensuring the stability and reliability of the etching process.

Experimental Example A2: Measuring Variation According to Time

The etching compositions produced in Examples A1 and A2 is mixed with a phosphoric acid. Etching for a nitride layer and an oxide layer was carried out, using each of the mixtures, immediately after mixing (0 hour) and at 8 hours after mixing. The etch rates and selectivity for the nitride layer and the oxide layer were measured. In Comparative Example 4 (base PA), the etch rate and selectivity for a nitride layer to and an oxide layer were evaluated using phosphoric acid in the same manner as the above examples.

The evaluation was performed at a process temperature of 160° C. The etch rate was determined by etching each of the layers for about 300 seconds and measuring the difference between the thickness of each layer before etching and the layer thickness of the each layer after etching. Thus, the etch rate is obtained by dividing the thickness difference by the etching time (minute). The etching selectivity is expressed as the ratio of the etch rate of the nitride film to that of the PSZ film. The evaluation results are shown in Table A4 below.

TABLE A4

| | | Etch rate (Å/min) of nitride layer | Etch rate (Å/min) of oxide layer | | Selectivity (nitride layer/PSZ) |
|---|---|---|---|---|---|
| | | | PSZ[1] | BPSG | |
| Example A1 | 0 hr | 58.24 | 0.67 | 0.76 | 86.92 |
| | After 8 hr | 58.24 | 0.67 | 0.76 | 86.92 |
| Example A2 | 0 hr | 58.73 | 0.52 | 0.73 | 112.94 |
| | After 8 hr | 58.73 | 0.52 | 0.73 | 112.94 |
| Example A4 | 0 hr | 60 | 15 | 90 | <4 |
| | After 8 hr | 60 | 15 | 90 | <4 |

[1]PSZ: Polysilazane layer

As can be seen in Table A4, the etching compositions of the present embodiment showed a very high etching selectivity for the nitride layer compared to a typical etching composition including phosphoric acid. Thus, when the high-selectivity etching composition of the present embodiment is used to remove a nitride layer, the nitride layer may be selectively etched, while the deterioration in electrical characteristics caused by damage to the oxide layer or etching of the oxide layer may be prevented and particle generation may be prevented, which improves the device properties.

Second Embodiment B: Manufacturing an Etching Composition

In according to the second embodiment B, an etching composition is manufactured by mixing silane inorganic acid salts with phosphoric acid at the weight ratios shown in Table B1 below. As a first inorganic acid, a 85% aqueous solution was used.

TABLE B1

| | 1st IA PA wt % | Silane Inorganic Acid Salts (SIAS) | | | |
|---|---|---|---|---|---|
| | | wt % | Silane Compound (SC) | 2nd IA | Weight ratio (2nd IA:SC) | PT (° C.) |
| Example B1 | 85 | 1 | SC expressed by Formula A1, wherein $R^1$ is methyl and $R^2$ to $R^4$ are chloro. | Pyrophosphoric acid | 10:100 | 70 |
| Example B2 | 85 | 1 | SC expressed by Formula A1, wherein $R^1$ to $R^4$ are ethoxyl. | Pyrophosphoric acid | 20:100 | 90 |
| Example B3 | 85 | 1 | SC expressed by Formula A1, wherein $R^1$ is methyl and $R^2$ to $R^4$ are chloro. | Pyrophosphoric acid | 20:100 | 70 |
| Example B4 | 85 | 1 | SC expressed by Formula A1 where $R^1$ to $R^4$ are ethoxyl. | Pyrophosphoric acid | 20:100 | 90 |

1) $1^{st}$ IA: first inorganic acid
2) $2^{nd}$ IA: second inorganic acid
3) PT: Process temperature

Experimental Example B1: Measuring Selectivity of Etching Composition

Using the etching composition of the second embodiment B1, etching for a nitride layer and an oxide layer was carried out at a process temperature of 157° C. Etch rate and selectivity for the nitride layer and the oxide layer were measured using an ellipsometer (NANO VIEW, SEMG-1000) that is a film thickness measurement system. The results of the measurement are shown in Table B2 below. The etch rate was determined by etching each of the layers for about 300 seconds and measuring the difference between the thickness of each layer before etching and the layer thickness of each layer after etching. Thus, the etch rate is obtained by dividing the thickness difference by the etching time (minute). The etching selectivity is expressed as the ratio of the etch rate of the nitride layer to that of the oxide layer.

Comparative Examples B1 to B3: Producing an Etching Composition

In Comparative Example B1, etching was carried out using phosphoric acid at a process temperature of 157° C. Etch rate and etching selectivity were measured in the same manner as the above Examples. In Comparative Example B2, etching was carried out using a mixture of 0.05% hydrofluoric acid and phosphoric acid mixed at a low temperature of 130° C. Etch rate and etching selectivity were measured in the same manner as the above Examples. In Comparative Example B3, etching was carried out using the same mixture as that of Comparative Example B2 at a process temperature of 157° C. Etch rate and etching selectivity were measured in the same manner as the above Examples. The phosphoric acid used in Comparative Examples B1 to B3 was a 85% aqueous solution of phosphoric acid. The results of measurement in Comparative Examples B1 to B3 are shown in Table B3 below.

TABLE B2

| | Process temperature (° C.) | Etch rate (Å/min) of nitride layer | Etch rate (Å/min) of oxide layer | | | Selectivity | |
|---|---|---|---|---|---|---|---|
| | | | $ThO_x$[1] | LP-TEOS[2] | BPSG[3] | LP-TEOS | BPSG |
| Example B1 | 157 | 58.63 | 0.24 | 0.20 | 0.71 | 293.15 | 82.58 |
| Example B2 | 157 | 58.65 | 0.21 | 0.25 | 0.75 | 234.60 | 78.20 |
| Example B3 | 157 | 58.57 | 0.25 | 0.15 | 0.71 | 390.47 | 82.49 |
| Example B4 | 157 | 58.31 | 0.23 | 0.17 | 0.81 | 343.00 | 71.99 |

[1] ThO: thermal oxide layer
[2] LP-TEOS: Low Pressure Tetra Ethyl Ortho Silicate layer
[3] BPSG: Borophosphate Silicate Glass layer

TABLE B3

| Etching composition | Process temp. (° C.) | Etch rate (Å/min) of nitride layer | Etch rate (Å/min) of oxide layer | | | Selectivity | |
|---|---|---|---|---|---|---|---|
| | | | ThOx | LP-TEOS | BPSG | LP-TEOS | BPSG |
| Comp. Example B1 | Phosphoric acid | 157 | 61.32 | 1.1 | 13.19 | 9.85 | 4.64 | 6.23 |
| Comp. Example B2 | Phosphoric acid + Hydrofluoric acid (0.05 wt %) | 130 | 15.44 | 0 | 2.3 | 1.03 | 6.71 | 14.99 |
| Comp. Example B3 | Phosphoric acid + Hydrofluoric acid (0.05 wt %) | 157 | 76.12 | 5.67 | 32.14 | 20.48 | 2.36 | 3.71 |

As can be seen in Table B2 and Table B3, the etching compositions showed a significantly high etching selectivity for the nitride layer with respect to the oxide layer compared to those of Comparative Examples B1 to B3. Thus, when the high-selectivity etching composition of the present embodiment is used, the EFH may be easily controlled by controlling the etch rate of the oxide layer, and damage to the oxide layer may be prevented. In addition, particle generation, which was problematic, may be prevented, thus ensuring the stability and reliability of the etching process.

Third Embodiment C: Manufacturing Etching Composition

In accordance with the third embodiment C, an etching composition is manufactured by mixing siloxane inorganic acid salts with phosphoric acid at the weight ratios shown in Table C1 below. As a first inorganic acid, a 85% aqueous solution was used.

TABLE C1

| | 1st IA PA wt % | Siloxane Inorganic Acid Salts | | | Weight ratio (2nd IA:SC) | PT(° C.) |
|---|---|---|---|---|---|---|
| | | PA wt % | Siloxane Compound (SxC) | 2nd IA | | |
| Example C1 | 85 | 2 | SxC expressed by Formula A2, wherein $R^6$ to $R^9$ are chloro, $R^5$ and $R^{10}$ are methyl, and n is 1. | Phosphoric acid (PA) | 50:100 | 90 |
| Example C2 | 83 | 4 | SxC expressed by Formula A2, wherein $R^6$ to $R^9$ are chloro, $R^5$ and $R^{10}$ are methyl, and n is 1. | Pyrophosphoric acid (PA) | 50:100 | 90 |
| Example C3 | 84 | 3 | SxC expressed by Formula A2, wherein $R^6$ to $R^9$ are chloro, $R^5$ and $R^{10}$ are methyl, and n is 1. | Sulfuric acid (SA) | 40:100 | 120 |
| Example C4 | 83 | 5 | SxC expressed by Formula A2, wherein $R^6$ to $R^9$ are chloro, $R^5$ and $R^{10}$ are methyl, and n is 1. | Nitric acid (NA) | 50:100 | 150 |
| Example C5 | 83 | 5 | SxC expressed by Formula A2, wherein $R^6$ to $R^9$ are chloro, $R^5$ | Polyphosphoric acid (containing three | 50:100 | 150 |

TABLE C1-continued

| 1st IA PA wt % | 2nd IA wt % | Siloxane Compound (SxC) | 2nd IA | Weight ratio (2nd IA:SC) | PT(° C.) |
|---|---|---|---|---|---|
| | | and $R^{10}$ are methyl, and n is 1. | phosphoric atoms) | | |

1st IA: first inorganic acid
2nd IA: second inorganic acid
PT: process temperature Experimental Example C1: Measuring Selectivity of Produced Etching Composition Using the etching composition of the third embodiment C1, etching for a nitride layer and an oxide layer was carried out at a process temperature of 157° C. Etch rate and selectivity for the nitride layer and the oxide layer were measured using an ellipsometer (NANO VIEW, SEMG-1000) that is a film thickness measurement system. The results of the measurement are shown in Table B2 below. The etch rate was determined by etching each of the layers for about 300 seconds and measuring the difference between the thickness of each layer before etching and the layer thickness of each layer after etching. Thus, the etch rate is obtained by dividing the thickness difference by the etching time (minute). The etching selectivity is expressed as the ratio of the etch rate of the nitride layer to that of the oxide layer.

TABLE C2

| | Process temperature (° C.) | Etch rate (Å/min) of nitride layer | Etch rate (Å/min) of oxide layer | | | Selectivity | |
|---|---|---|---|---|---|---|---|
| | | | $ThO_x$[1] | LP-TEOS[2] | BPSG[3] | LP-TEOS | BPSG |
| Example C1 | 157 | 58.16 | 0.33 | 0.27 | 0.75 | 215.41 | 77.55 |
| Example C2 | 157 | 58.43 | 0.35 | 0.24 | 0.80 | 243.46 | 73.04 |
| Example C3 | 157 | 58.75 | 0.35 | 0.28 | 0.75 | 209.82 | 78.33 |
| Example C4 | 157 | 58.35 | 0.35 | 0.24 | 0.78 | 243.13 | 74.81 |

[1]ThO: thermal oxide layer
[2]LP-TEOS: Low Pressure Tetra Ethyl Ortho Silicate layer
[3]BPSG: Borophosphate Silicate Glass layer Comparative Examples C1 to C3: Producing an Etching Composition In Comparative Example C1, etching was carried out using phosphoric acid at a process temperature of 157° C. Etch rate and etching selectivity were measured in the same manner as the above Examples. In Comparative Example C2, etching was carried out using a mixture of 0.05% hydrofluoric acid and phosphoric acid mixed at a low temperature of 130° C. Etch rate and etching selectivity were measured in the same manner as the above Examples. In Comparative Example C3, etching was carried out using the same mixture as that of Comparative Example C2 at a process temperature of 157° C. Etch rate and etching selectivity were measured in the same manner as the above Examples. The phosphoric acid used in Comparative Examples C1 to C3 was a 85% aqueous solution of phosphoric acid. The results of measurement in Comparative Examples C1 to C3 are shown in Table C3 below.

TABLE C3

| Etching composition | Process temp. (° C.) | Etch rate (Å/min) of nitride layer | Etch rate (Å/min) of oxide layer | | | Selectivity | |
|---|---|---|---|---|---|---|---|
| | | | ThOx | LP-TEOS | BPSG | LP-TEOS | BPSG |
| Comp. Example C1 | Phosphoric acid | 157 | 61.32 | 1.1 | 13.19 | 9.85 | 4.64 | 6.23 |
| Comp. Example C2 | Phosphoric acid + Hydrofluoric acid (0.05 wt %) | 130 | 15.44 | 0 | 2.3 | 1.03 | 6.71 | 14.99 |
| Comp. Example C3 | Phosphoric acid + Hydrofluoric acid (0.05 wt %) | 157 | 76.12 | 5.67 | 32.14 | 20.48 | 2.36 | 3.71 |

As can be seen in Table C2 and Table C3, the etching compositions showed a significantly high etching selectivity for the nitride layer with respect to the oxide layer compared to those of Comparative Examples C1 to C3. Thus, when the high-selectivity etching composition of the present embodiment is used, the EFH may be easily controlled by controlling the etch rate of the oxide layer, and damage to the oxide layer may be prevented. In addition, particle generation, which was problematic, may be prevented, thus ensuring the stability and reliability of the etching process.

Experimental Example C2: Measuring Variation According to Time

Using the etching compositions produced in the Examples C1, etching for a nitride layer and an oxide layer was carried out immediately after mixing (0 hour) with phosphoric acid and at 8 hours after mixing with phosphoric acid. The etch rates and selectivity for the nitride layer and the oxide layer were measured. In Comparative Example C4, the etch rate and selectivity for a nitride layer and an oxide layer were evaluated using phosphoric acid in the same manner as the above examples.

The evaluation was performed at a process temperature of 160° C. The etch rate was determined by etching each of the layers for about 300 seconds and measuring the difference between the thickness of each layer before etching and the layer thickness of the each layer after etching. Thus, the etch rate is obtained by dividing the thickness difference by the etching time (minute). The etching selectivity is expressed as the ratio of the etch rate of the nitride film to that of the PSZ film. The evaluation results are shown in Table C4 below.

TABLE C4

| | | Etch rate (Å/min) of nitride layer | Etch rate (Å/min) of oxide layer | | Selectivity (nitride layer/PSZ) |
|---|---|---|---|---|---|
| | | | PSZ[1] | BPSG | |
| Example C1 | 0 hr | 58.24 | 0.50 | 0.73 | 116.92 |
| | After 8 hr | 58.24 | 0.50 | 0.73 | 116.92 |
| Example C4 | 0 hr | 60 | 15 | 90 | <4 |
| | After 8 hr | 60 | 15 | 90 | <4 |

[1]PSZ: Polysilazane layer

As can be seen in Table C4, the etching compositions of the example C1 showed a very high etching selectivity for the nitride layer compared to a typical etching composition including phosphoric acid. Thus, when the high-selectivity etching composition of the present embodiment is used to remove a nitride layer, the nitride layer may be selectively etched, while the deterioration in electrical characteristics caused by damage to the oxide layer or etching of the oxide layer may be prevented and particle generation may be prevented, which improves the device properties.

Fourth Embodiment D: Manufacturing Etching Composition

In accordance with the fourth embodiment D, an etching composition is manufactured by mixing silane inorganic acid salts with phosphoric acid at the weight ratios shown in Table D1 below. As the phosphoric acid, a 85% aqueous solution was used.

TABLE D1

| | 1st IA PA wt % | First Silane Compound (1$^{st}$ SC) wt % | | Silane Inorganic Acid Salts (SIAS) | | | |
|---|---|---|---|---|---|---|---|
| | | | wt % | Second Silane Compound (2$^{nd}$ SC) | 2nd IA | Weight ratio (2nd IA:SC) | PT (° C.) |
| Exam. D1 | 85 | 1$^{st}$ SC expressed by Formula A1, wherein R$^1$ is methyl and R$^2$ to R$^4$ are chloro. (1) | 2 | 2$^{nd}$ SC expressed by Formula A1, wherein R$^1$ is methyl and R$^2$ to R$^4$ are chloro. | Phosphoric acid (PA) | 20:100 | 90 |
| Exam. D2 | 85 | 1$^{st}$ SC expressed by Formula A1, wherein R$^1$ to R$^4$ are ethoxyl. (1) | 2 | 2$^{nd}$ SC expressed by Formula A1, wherein R$^1$ to R$^4$ are ethoxyl. | Phosphoric acid (PA) | 20:100 | 120 |
| Exam. D3 | 85 | 1$^{st}$ SC expressed by Formula A2, wherein R$^6$ to R$^9$ are chloro, R$^5$ and R$^{10}$ are methyl, and n is 1. (1) | 1 | 2$^{nd}$ SC expressed by Formula A2 wherein R$^6$ to R$^9$ are chloro, R$^5$ and R$^{10}$ are methyl, and n is 1. | Phosphoric acid (PA) | 50:100 | 90 |
| Exam. D4 | 85 | 1$^{st}$ Sc expressed by Formula A1, wherein R$^1$ is methyl and R$^2$ to R$^4$ are chloro. (2) | 3 | 2$^{nd}$ SC expressed by Formula A1, wherein R$^1$ is methyl and R$^2$ to R$^4$ are chloro. | Sulfuric acid (SA) | 20:100 | 90 |
| Exam. D5 | 85 | 1$^{st}$ SC expressed by Formula A1, wherein R$^1$ is methyl and R$^2$ to R$^4$ are chloro. (1) | 2 | 2$^{nd}$ SC expressed by Formula A1 where R$^1$ is methyl and R$^2$ to R$^4$ are chloro. | Nitric acid (NA) | 10:100 | 120 |

Experimental Example D1: Measure Selectivity of Produced Etching Composition Using the produced etching composition of the fourth embodiment, etching for a nitride layer and an oxide layer was carried out at a process temperature of 157° C. Etch rate and selectivity for the nitride layer and the oxide layer were measured using an ellipsometer (NANO VIEW, SEMG-1000) that is a film thickness measurement system. The results of the measurement are shown in Table D2 below. The etch rate was determined by etching each of the layers for about 300 seconds and measuring the difference between the thickness of each layer before etching and the layer thickness of each layer after etching. Thus, the etch rate is obtained by dividing the thickness difference by the etching time (minute). The etching selectivity is expressed as the ratio of the etch rate of the nitride layer to that of the oxide layer.

TABLE D2

| | Process temperature (° C.) | Etch rate (Å/min) of nitride layer | Etch rate (Å/min) of oxide layer | | | Selectivity | |
|---|---|---|---|---|---|---|---|
| | | | ThO$_x$[1] | LP-TEOS[2] | BPSG[3] | LP-TEOS | BPSG |
| Example D1 | 157 | 58.3 | 0.31 | 0.31 | 0.73 | 188.06 | 79.86 |
| Example D2 | 157 | 58.6 | 0.32 | 0.32 | 0.73 | 183.13 | 80.27 |

[1]ThO: thermal oxide layer
[2]LP-TEOS: Low Pressure Tetra Ethyl Ortho Silicate layer
[3]BPSG: Borophosphate Silicate Glass layer

Comparative Examples D1 to D3: Producing Etching Composition

In Comparative Example D1, etching was carried out using phosphoric acid at a process temperature of 157° C.

Etch rate and etching selectivity were measured in the same manner as the above Examples. In Comparative Example D2, etching was carried out using a mixture of 0.05% hydrofluoric acid and phosphoric acid mixed at a low temperature of 130° C. In Comparative Example D3, etching was carried out using the same mixture as that of Comparative Example D2 at a process temperature of 157° C. In Comparative Examples D2 and D3, the etch rate and selectivity were measured in the same manner as the above Examples. The phosphoric acid used in Comparative Examples D1 to D3 was a 85% aqueous solution of phosphoric acid. The results of measurement in Comparative Examples D1 to D3 are shown in Table D3 below.

TABLE D3

| | Etching composition | Process temp. (° C.) | Etch rate (Å/min) of nitride layer | Etch rate (Å/min) of oxide layer | | | Selectivity | |
|---|---|---|---|---|---|---|---|---|
| | | | | ThOx | LP-TEOS | BPSG | LP-TEOS | BPSG |
| Comp. Example D1 | Phosphoric acid | 157 | 61.32 | 1.1 | 13.19 | 9.85 | 4.64 | 6.23 |
| Comp. Example D2 | Phosphoric acid + Hydrofluoric acid (0.05 wt %) | 130 | 15.44 | 0 | 2.3 | 1.03 | 6.71 | 14.99 |
| Comp. Example D3 | Phosphoric acid + Hydrofluoric acid (0.05 wt %) | 157 | 76.12 | 5.67 | 32.14 | 20.48 | 2.36 | 3.71 |

As can be seen in Table D2 and Table D3, the etching compositions showed a significantly high etching selectivity for the nitride layer with respect to the oxide layer compared to those of Comparative Examples A1 to A3. Thus, when the high-selectivity etching composition of the present embodiment is used, the EFH may be easily controlled by controlling the etch rate of the oxide layer, and damage to the oxide layer may be prevented. In addition, particle generation, which was problematic, may be prevented, thus ensuring the stability and reliability of the etching process.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

The present invention can be embodied in the form of methods and apparatuses for practicing those methods. The present invention can also be embodied in the form of program code embodied in tangible media, non-transitory media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

No claim element herein is to be construed under the provisions of 35 U.S.C. § 112, sixth paragraph, unless the element is expressly recited using the phrase "means for" or "step for."

Although embodiments of the present invention have been described herein, it should be understood that the foregoing embodiments and advantages are merely examples and are not to be construed as limiting the present invention or the scope of the claims. Numerous other modifications and embodiments can be devised by those skilled in the art that will fall within the spirit and scope of the principles of this disclosure, and the present teaching can also be readily applied to other types of apparatuses. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A composition comprising:
a first inorganic acid;
at least one of siloxane inorganic acid salts generated through reaction between a second inorganic acid and a siloxane compound; and
a solvent,
wherein the second inorganic acid is one selected from the group consisting of a phosphoric acid, an anhydrous phosphoric acid, a pyrophosphoric acid, a polyphosphoric acid, and a combination thereof,
wherein the at least one of siloxane inorganic acid salts includes compounds represented by a fourth formula:

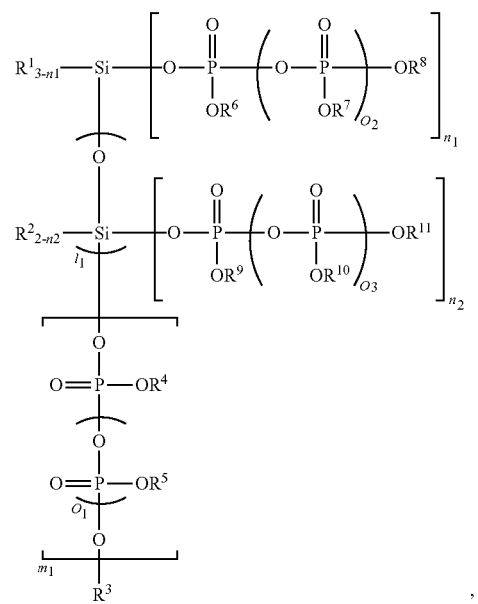

where i) each one of $R^1$ to $R^2$ is selected from the group consisting of hydrogen, halogen, ($C_1$-$C_{10}$) alkyl, ($C_1$-$C_{10}$) alkoxy, and ($C_6$-$C_{30}$) aryl, ii) $n_1$ is one of integer numbers from 0 to 3, iii) $n_2$ is one of integer numbers from 0 to 2, iv) $m_1$ is one of integer numbers 0 and 1, v) a sum of $n_1$, $n_2$, and $m_1$ is equal or greater than 1 ($n_1+n_2+m_1 \geq 1$), vi) $l_1$ is one of integer numbers from 1 to 10, vii) each one of $O_1$ to $O_3$ is one of integer numbers from 0 to 10, and viii) each one of $R^3$ to $R^{11}$ is hydrogen.

2. The composition of claim 1, wherein in the at least one of siloxane inorganic acid salts represented by the fourth formula, at least one of hydrogens selected from the group consisting of $R^3$ to $R^{11}$ is substituted by a substituent expressed by a fifth formula:

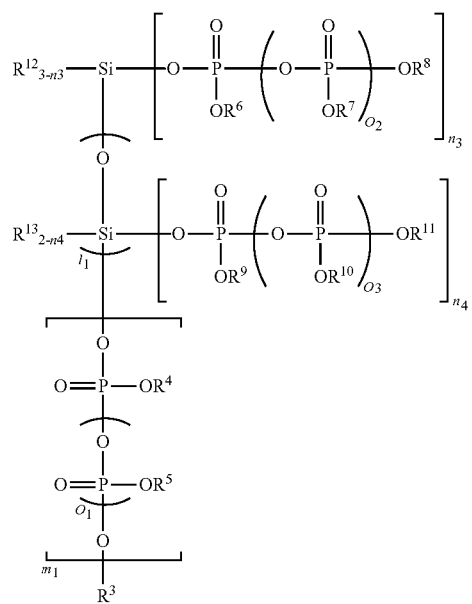

where i) one of $R^{12}$ and $R^{13}$ is a coupler to the fourth formula, ii) the others are independently selected from the group consisting of hydrogen, halogen, $(C_1-C_{10})$ alkyl, $(C_1-C_{10})$ alkoxy, and $(C_6-C_{30})$ aryl, iii) each one of $R^3$ to $R^{11}$ is hydrogen or is substituted by a substituent expressed by the fifth formula, iv) $n_3$ is one of integer numbers from 0 to 3, v) $n_4$ is one of integer numbers from 0 to 2, vi) $m_1$ is one of integer numbers from 0 to 1, vii) $l_1$ is one of integer numbers from 1 to 10, and viii) each one of $O_1$ to $O_3$ is one of integer numbers from 0 to 10.

\* \* \* \* \*